United States Patent
Lee et al.

(10) Patent No.: US 8,407,508 B2
(45) Date of Patent: Mar. 26, 2013

(54) SERIAL BUS CLOCK FREQUENCY CALIBRATION SYSTEM AND METHOD THEREOF

(75) Inventors: Wei-te Lee, Banqiao (TW); Shin-te Yang, Taichung (TW); Wen-ming Huang, Dasi (TW)

(73) Assignee: Genesys Logic, Inc., Shindian, Taipei (TW)

( * ) Notice: Subject to any disclaimer, the term of this patent is extended or adjusted under 35 U.S.C. 154(b) by 392 days.

(21) Appl. No.: 12/884,164

(22) Filed: Sep. 16, 2010

(65) Prior Publication Data

US 2011/0016346 A1    Jan. 20, 2011

Related U.S. Application Data

(63) Continuation-in-part of application No. 12/388,373, filed on Feb. 18, 2009, now Pat. No. 8,140,882.

(30) Foreign Application Priority Data

Jul. 22, 2010    (TW) ............................... 99124138 A

(51) Int. Cl.
*H03D 3/24*    (2006.01)

(52) U.S. Cl. ........ 713/400; 713/401; 713/500; 713/501; 713/502; 713/503; 713/600; 713/601; 375/355; 375/362; 375/371; 375/374

(58) Field of Classification Search ............ 713/40–401, 713/500–503, 600–601; 375/355, 362, 371, 375/374

See application file for complete search history.

(56) References Cited

U.S. PATENT DOCUMENTS

| | | | |
|---|---|---|---|
| 6,297,705 B1 * | 10/2001 | Williams et al. | 331/44 |
| 6,407,641 B1 * | 6/2002 | Williams et al. | 331/1 A |
| 6,525,616 B1 * | 2/2003 | Williams et al. | 331/44 |
| 6,946,920 B1 * | 9/2005 | Williams et al. | 331/44 |
| 7,093,151 B1 * | 8/2006 | Williams | 713/500 |
| 7,453,958 B2 * | 11/2008 | Greco et al. | 375/326 |
| 2009/0252212 A1 * | 10/2009 | Risk et al. | 375/231 |
| 2011/0016346 A1 * | 1/2011 | Lee et al. | 713/503 |

* cited by examiner

*Primary Examiner* — M Elamin

(57) ABSTRACT

A serial bus clock frequency calibration system and a method thereof are disclosed herein. The system utilizes a first frequency calibration device, a second frequency calibration device and a third frequency calibration device to share the same oscillator as so to perform multi-stage clock frequency resolution calibrations for different frequency-tuning ranges. This can bring an optimal frequency resolution, greatly reduce system complexity and save element cost.

25 Claims, 16 Drawing Sheets

SERIAL BUS CLOCK FREQUENCY CALIBRATION SYSTEM AND METHOD THEREOF

CROSS-REFERENCE TO RELATED APPLICATION

This patent application is a continuation-in-part of U.S. application Ser. No. 12/388,373, filed Feb. 18, 2009 now U.S. Pat. No. 8,140,882 which is herein incorporated by reference in the entirety and assigned to the same assignee.

FIELD OF THE INVENTION

This present invention relates to a serial bus clock frequency calibration system and a method thereof, and more particularly, to a serial bus clock frequency calibration system and a method thereof for multi-stage raising a clock frequency resolution of data transmission between a serial bus host and a serial bus device.

BACKGROUND OF THE INVENTION

Since various kinds of current consumptive electronic products such as a communication device (e.g. a mobile phone), an image-capturing device, a storage device and a networking device are almost developed in a tendency of multiple functions, i.e. a high definition, a high density or a high storage volume, this brings a demand on instantly processing a huge amount of digital contents. For convenience of the user on rapidly transmitting a huge amount of digital contents between a host and its peripheral devices, most of said consumptive electronic products are disposed with a widely-used high-speed serial bus transmission architecture including, for example, an universal serial bus (USB) or an IEEE1394 interface transmission architecture.

In the current USB interface data transmission architecture, the last standard specification of the USB has been developed to 3.0 version. USB 3.0 version is not only compatible with USB 2.0 version to own most of the original functions of USB 2.0 (e.g. retaining a micro-frame timer range of 125 microseconds) but also provides an operation with a super-speed data transmission speed of up to 5 Gbps, which is faster over 10 times than the highest data transmission speed 480 Mbps of a high-speed or full-speed USB 2.0 version. However, under this manner, a super-speed signal transmission of USB 3.0 has a lower tolerable frequency error with relative to a high-speed or full-speed signal transmission of USB 2.0.

Referring to FIG. 1, a conventional USB interface data transmission architecture is shown, which includes a USB 2.0-standardized host 10 and a USB 2.0/3.0-standardized device 12 connected with the host 10 via corresponding USB interfaces for transmitting a high-speed or full-speed USB 2.0-standardized signal therebetween. Since the signal transmission frequency resolution required for the USB interface is very high, a USB control chip of the USB device 12 needs to employ an external crystal oscillator 14 for generating a clock frequency to be a working frequency thereof. However, the usage of the external crystal oscillator 14 does not only cost higher but also invokes occurrence of a frequency error problem in the working frequency in comparison with a USB 2.0-standardized input signal transmitted from the USB host 10. Assuming another manner that the USB host 10 and USB device 12 both are standardized in USB 3.0 version specification, a tolerable frequency error needed for the USB device 12 receiving the super-speed transmission signal of USB 3.0 is lower than needed for the USB device 12 receiving a high-speed or full-speed transmission signal of USB 2.0. It means that the demand on a clock frequency resolution of the super-speed transmission signal of USB 3.0 is higher.

Furthermore referring to FIG. 2, which shows another conventional USB interface data transmission architecture disclosed in TW Patent Pub. No. 200719154 (as thereafter referred to Patent Pub. No. '154) including a USB host 20 and a USB device 22 connected with each other for transmitting USB signal therebetween. As shown in FIG. 2 of Patent Pub. No. '154, the USB device needs to additionally employ a frequency signal source 24 (referring to a reference clock generating circuit 132 disclosed in FIG. 7 of Patent Pub. No. '154) to provide a reference clock signal according to a corrected output signal. Then, a frequency synthesizer (as referring to a phase-locked loop 134 disclosed in FIG. 7 of Patent Pub. No. '154) is used to calibrate a working frequency according to the reference clock signal. However, such a conventional circuit design is highly complicated and costs higher. For USB transmission signal, the working frequency calibrated by the frequency signal source generated from the reference clock generating circuit still has the inaccurate frequency resolution problem. Specially, if the USB host 20 and USB device 22 both are standardized in USB 3.0 version specification, the demand on a clock frequency resolution of the super-speed transmission signal of USB 3.0 is greatly higher.

SUMMARY OF THE INVENTION

To eliminate the drawbacks of the aforementioned prior art, a primary objective of the present invention is to provide a serial bus clock frequency calibration system and a method thereof, which integrate two-stage clock frequency resolution calibrations with different frequency tuning ranges, one of which firstly treats the start of frame (SOF) signal as a preliminary reference for coarsely tuning an operating clock frequency of a USB device, and the other of which treats a USB input signal as a reference clock frequency for continuously fine tuning the operating clock frequency of the USB device, and thereby achieve an optimum clock frequency resolution.

Another objective of the present invention is to provide a serial bus clock frequency calibration system and a method thereof which use a first frequency calibration device and a second frequency calibration device both to share the same oscillator for executing two-stage clock frequency resolution calibrations, and thereby greatly reduce system complexity and save element cost.

Another objective of the present invention is to provide a serial bus clock frequency calibration system and a method thereof which integrate multi-stage clock frequency resolution calibrations with different frequency tuning ranges, wherein a first-stage firstly treats a start of frame (SOF) signal in a first type serial bus (as standardized in USB 2.0) input signal as a preliminary reference for coarsely tuning an operating clock frequency of a USB device and thereby outputting a first clock frequency, a second stage succeeding the first-stage treats a frequency of the first type serial bus input signal as a reference clock frequency for continuously finely tuning the first clock frequency of the USB device to reach a second clock frequency, and a third stage succeeds the second stage and utilizes a time information contained in a specific packet (e.g. an Isochronous Timestamp Packet (ITP)) in a second type serial bus (as standardized in USB 3.0) input signal to continuously tuning the second clock frequency of the USB device to reach a third clock frequency and thereby achieving a highest clock frequency resolution.

Another objective of the present invention is to provide a serial bus clock frequency calibration system and a method thereof which use a first frequency calibration device, a second frequency calibration device and a third frequency calibration device all to share and adjust the same oscillator for executing multi-stage clock frequency resolution calibrations, and thereby greatly reduce system complexity and save element cost.

Another objective of the present invention is to provide a serial bus clock frequency calibration system and a method thereof which integrate multi-stage clock frequency resolution calibrations with different frequency tuning ranges, wherein a first-stage firstly utilizes a start of frame (SOF) signal in a first type serial bus input signal to tune an operating clock frequency of a USB device and thereby achieve a first clock frequency, and a second stage succeeds the first-stage and utilizes a time information contained in a specific packet (e.g. an Isochronous Timestamp Packet (ITP)) in a second type serial bus input signal to continuously tuning the first clock frequency of the USB device to reach a second clock frequency and thereby achieving a highest clock frequency resolution.

To achieve the aforementioned invention objectives, a serial bus clock frequency calibration system according to a first embodiment of the present invention provides a serial bus clock frequency calibration system applied to a USB device which is configured to receive a first type serial bus input signal, wherein the first type serial bus input signal has at least one SOF periodic signal and a reference clock frequency. The serial bus clock frequency calibration system comprises an oscillator, a first frequency calibration device and a second frequency calibration device. In operation of the system, the first frequency calibration device and the second frequency calibration device can respectively perform two-stage clock frequency resolution calibrations on the oscillator. Said first type serial bus input signal is standardized in USB 2.0 specification.

The first frequency calibration device is configured to generate a first control signal to set up a first-stage frequency tuning range based on the SOF periodic signal and the variable clock frequency outputted from the oscillator so as to continuously tune the variable clock frequency to reach a first clock frequency conforming with the interval time defined between the periodic signals and simultaneously generate a second control signal. Substantially, the first frequency calibration device and the oscillator constitute a first-stage frequency acquisition loop so as to vary or maintain the variable clock frequency outputted from the oscillator.

The second frequency calibration device is based on enabling of the second control signal and a phase or edge of the reference clock frequency to generate a third control signal to set up a second frequency tuning range so as to continuously tune the variable clock frequency from the first clock frequency to reach a second clock frequency approaching the reference clock frequency. Substantially, the second frequency calibration device and the oscillator constitute a second-stage frequency acquisition loop to vary or maintain the variable clock frequency outputted from the oscillator, wherein the second-stage frequency acquisition loop is implemented in a phase lock loop or a frequency lock loop.

Besides, a serial bus clock frequency calibration method according to a second embodiment of the present invention is applied to a USB device having a first frequency calibration device, a second frequency calibration device and an oscillator, and comprises the following steps of:

when the USB device receives a first type serial bus input signal containing at least one SOF periodic signal and a reference clock frequency, using the first frequency calibration device based on whether the interval time of the SOF periodic signal counted by a variable clock frequency outputted from the oscillator is matched to generate a first control signal to vary or maintain the variable clock frequency outputted from the oscillator until achieving a first clock frequency conforming with an interval time defined between the SOF periodic signals and simultaneously generating a second control signal; and when the second control signal enables the second frequency calibration device, the second frequency calibration device generates a third control signal, based on a phase or edge difference between the reference clock frequency and the variable clock frequency outputted from the oscillator, to vary or maintain the variable clock frequency outputted from the oscillator until achieving a second clock frequency conforming with the reference clock frequency.

A serial bus clock frequency calibration system according to a third embodiment of the present invention is applied to a USB device which is configured to receive a first type serial bus input signal or a second type serial bus input signal, wherein the first type serial bus input signal contains at least one SOF periodic signal and a reference clock frequency, and the second type serial bus input signal contains at least one specific packet. The serial bus clock frequency calibration system comprises: a first frequency calibration device, a second frequency calibration device, a third frequency calibration device and an oscillator, wherein during operation of the serial bus clock frequency calibration system, the first frequency calibration device, the second frequency calibration device and the third frequency calibration device can respectively perform multi-stage clock frequency resolution calibrations on the oscillator. Said first type serial bus input signal is standardized in USB 2.0 specification and the second type serial bus input signal is standardized in USB 3.0 specification.

It notes that the third embodiment has the same first and second frequency calibration devices as the first embodiment.

The third frequency calibration device is configured to generate a fourth control signal, based on the time information contained in the specific packet in the second type serial bus input signal and the variable clock frequency outputted from the oscillator, to set up a third stage frequency tuning range of the oscillator so as to continuously tune the variable clock frequency outputted from the oscillator until achieving a third clock frequency conforming with the interval time corresponding to the at least one specific packet. Substantially, the third frequency calibration device and the oscillator constitute a third-stage frequency acquisition loop to vary or maintain the variable clock frequency outputted from the oscillator.

A serial bus clock frequency calibration method according to a fourth embodiment of the present invention is applied to a USB device having a first frequency calibration device, a second frequency calibration device, a third frequency calibration device and an oscillator, and comprises the following steps of:

when the USB device receives a first type serial bus input signal containing at least one SOF periodic signal and a reference clock frequency, using the first frequency calibration device to generate a first control signal, based on whether the interval time of the SOF periodic signal counted by a variable clock frequency outputted from the oscillator is matched, to vary or maintain the variable clock frequency outputted from the oscillator until achieving a first clock frequency conforming with an interval time defined between the SOF periodic signals and simultaneously generating a second control signal;

when the second control signal enables the second frequency calibration device, the second frequency calibration device generates a third control signal, based on a phase or edge difference between the reference clock frequency and the variable clock frequency outputted from the oscillator, to vary or maintain the variable clock frequency outputted from the oscillator until achieving a second clock frequency conforming with the reference clock frequency; and when the USB device receives a second type serial bus input signal containing at least one specific packet, using the third frequency calibration device to generate a fourth control signal, based on whether an interval time corresponding to the at least one specific packet and counted by the variable clock frequency outputted from the oscillator is matched or not, to vary or maintain the variable clock frequency outputted from the oscillator until achieving a third clock frequency conforming with the interval time corresponding to the at least one specific packet.

Besides, a serial bus clock frequency calibration system according to a fifth embodiment of the present invention is applied to a USB device which is configured to receive a first type serial bus input signal or a second type serial bus input signal, wherein the first type serial bus input signal contains at least one SOF periodic signal and a reference clock frequency, and the second type serial bus input signal contains at least one specific packet. The serial bus clock frequency calibration system comprises a first frequency calibration device, a second frequency calibration device and an oscillator, wherein during operation of the serial bus clock frequency calibration system, the first frequency calibration device and the second frequency calibration device can respectively perform multi-stage clock frequency resolution calibrations on the oscillator. Said first type serial bus input signal is standardized in USB 2.0 specification and the second type serial bus input signal is standardized in USB 3.0 specification.

The first frequency calibration device is configured to generate a first control signal, based on whether the SOF periodic signal and the variable clock frequency outputted from the oscillator, to set up a first-stage frequency tuning range of the oscillator so as to continuously tune the variable clock frequency outputted from the oscillator until achieving a first clock frequency conforming with an interval time defined between the SOF periodic signals. Substantially, the first frequency calibration device and the oscillator constitute a first-stage frequency acquisition loop so as to vary or maintain the variable clock frequency outputted from the oscillator.

The second frequency calibration device is configured to generate a second control signal, based on the time information contained in the specific packet in the second type serial bus input signal and the variable clock frequency outputted from the oscillator, to set up a second stage frequency tuning range of the oscillator so as to continuously tune the variable clock frequency outputted from the oscillator until achieving a second clock frequency conforming with the interval time corresponding to the at least one specific packet. Substantially, the second frequency calibration device and the oscillator constitute a second-stage frequency acquisition loop to vary or maintain the variable clock frequency outputted from the oscillator.

A serial bus clock frequency calibration method according to a sixth embodiment of the present invention is applied to a USB device having a first frequency calibration device, a second frequency calibration device and an oscillator, and comprises the following steps of:

when the USB device receives a first type serial bus input signal containing at least one SOF periodic signal and a reference clock frequency, using the first frequency calibration device to generate a first control signal, based on whether the interval time of the SOF periodic signal counted by a variable clock frequency outputted from the oscillator is matched, to vary or maintain the variable clock frequency outputted from the oscillator until achieving a first clock frequency conforming with an interval time defined between the SOF periodic signals; and when the USB device receives a second type serial bus input signal containing at least one specific packet, using the third frequency calibration device to generate a second control signal, based on whether an interval time corresponding to the at least one specific packet and counted by the variable clock frequency outputted from the oscillator is matched or not, to vary or maintain the variable clock frequency outputted from the oscillator until achieving a second clock frequency conforming with the interval time corresponding to the at least one specific packet.

A serial bus clock frequency calibration system according to a seventh embodiment of the present invention is applied to a USB device and primarily comprises a first frequency calibration device, a second frequency calibration device, a third frequency calibration device, an oscillator and a link layer. A difference from the serial bus clock frequency calibration system of the third embodiment is that in the seventh embodiment, the first and third frequency calibration devices share the same interval counter and the same frequency error detector but the rest components all thereof are identical to the third preferred embodiment and therefore are omitted in description hereafter.

A serial bus clock frequency calibration system according to an eighth embodiment of the present invention is applied to a USB device and primarily comprises a first frequency calibration device, a second frequency calibration device, an oscillator and a link layer. A difference from the serial bus clock frequency calibration system of the fifth embodiment is that in the eighth embodiment, the first and second frequency calibration devices share the same interval counter and the same frequency error detector but the rest components all thereof are identical to the fifth preferred embodiment and therefore are omitted in description hereafter.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

In order to make the illustration of the present invention more explicit and complete, the following description is stated with reference to illustrations of FIG. 3 through FIG. 17.

Figure 1:
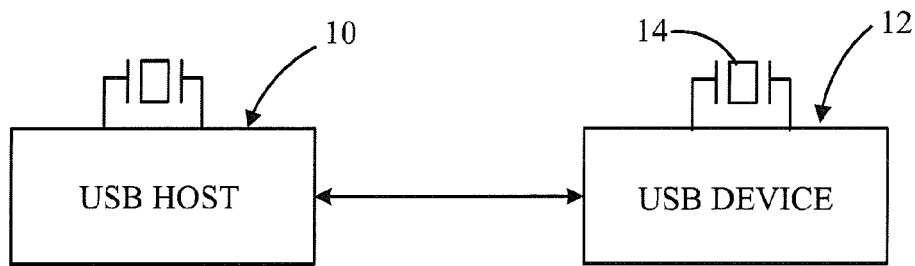
FIG. 1 is a schematic diagram showing a conventional USB interface data transmission architecture between a USB host and a USB device.
Figure 2:
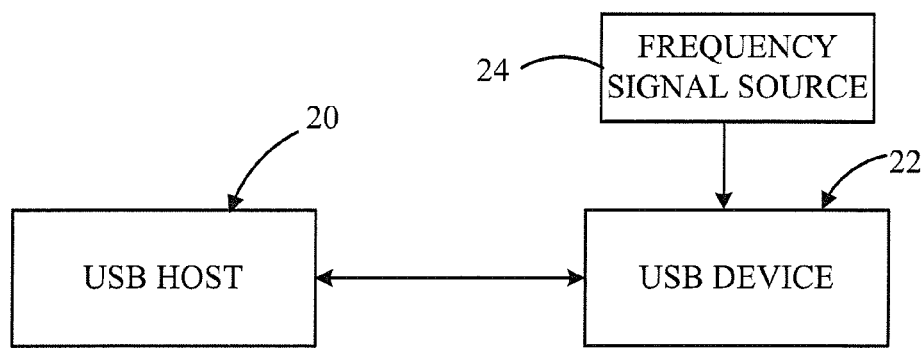
FIG. 2 is a schematic diagram showing another conventional USB interface data transmission architecture between a USB host and a USB device.
Figure 3:
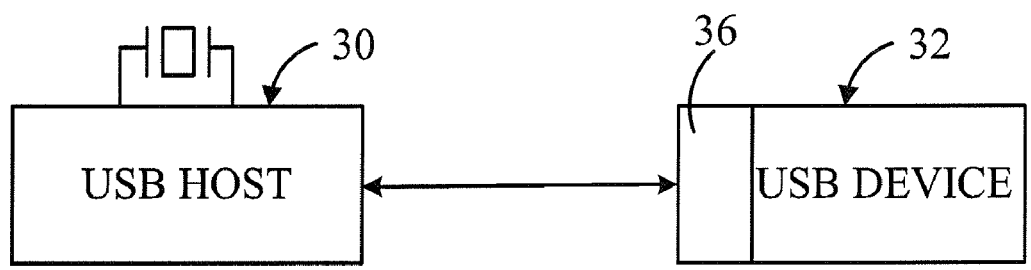
FIG. 3 is a schematic diagram showing an USB interface data transmission architecture between a USB host and a USB device according to a first preferred embodiment of the present invention.

Referring to FIG. 3, a functional block diagram according to a first preferred embodiment of the present invention shows a USB (Universal Serial Bus) host 30 and a USB device 32 for performing a USB interface signal transmission there between. The USB device 32 such as a USB hub includes a serial bus clock frequency calibration system 36 configured to perform two-stage clock frequency resolution calibrations with different tuning ranges, according to a USB input signal transmitted from the USB host 30 to the USB device 32. The two-stage clock frequency resolution calibrations comprise a first-stage resolution calibration and a second stage resolution calibration. The first-stage resolution calibration utilizes a SOF signal of the USB input signal which is a periodic signal to be a preliminary reference for coarse tuning an operation clock frequency required for the USB device 32. By following the first-stage resolution calibration, the second stage resolution calibration utilizes a frequency of the USB input signal to be a reference clock frequency for continuously fine tuning the operation clock frequency of the USB device 32 to approach the frequency of the USB input signal, and thereby achieve an optimum clock frequency resolution. In the first embodiment, said USB host 30 and USB device 32 both are standardized in USB 2.0 specification. In another embodiment, said USB host 30 is standardized in USB 3.0 or 2.0 specification but the USB device 32 is standardized in USB 3.0 specification. Thus, the USB input signal transmitted between said USB host 30 and USB device 32 is also standardized in USB 3.0 or 2.0 specification.

Figure 4:
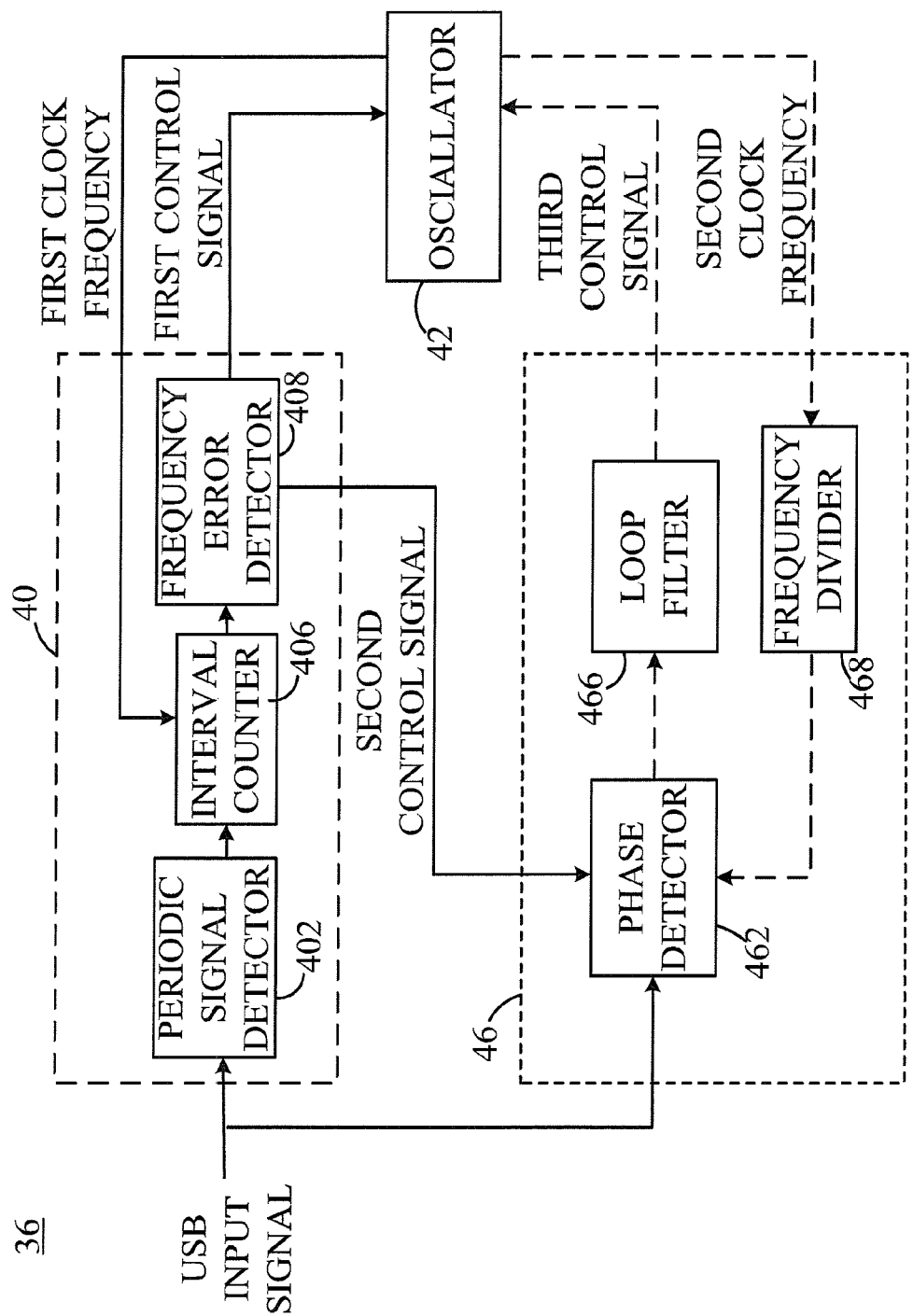
FIG. 4 is a functional block diagram showing a serial bus clock frequency calibration system according to the first preferred embodiment of the present invention.

Further referring to FIG. 4, a basic architecture of the serial bus clock frequency calibration system 36 according to the first preferred embodiment of the present invention is presented herein and primarily comprises a first frequency calibration device 40, an oscillator 42 and a second frequency calibration device 46. Upon operation of the serial bus clock frequency calibration system 36, the oscillator 42 respectfully outputs different variable clock frequencies to the first frequency calibration device 40 and the second frequency calibration device 46. Once the USB input signal is inputted to the serial bus clock frequency calibration system 36, the first frequency calibration device 40 and the second frequency calibration device 46 simultaneously receive the USB input signal to perform two-stage clock frequency resolution calibrations on the variable clock frequency outputted from the oscillator 42.

The first frequency calibration device 40 further includes a periodic signal detector 402, an interval counter 406 and a frequency error detector 408, wherein the periodic signal detector 402 is configured to detect the occurrence of the SOF periodic signal data format within the USB input signal. The interval counter 406 employs the variable clock frequency transmitted from the oscillator 42 to count the cycle numbers of single or multiple interval of the SOF periodic signal, and thereby achieve a working count value. The frequency error detector 408 compares the working count value with a predetermined goal count value of SOF interval time to determine if both of the values match or are close. According to the different comparison results, the frequency error detector 408 generates a first control signal with different levels to the oscillator 42, and simultaneously generates a second control signal with different levels to the second frequency calibration device 46. The variable clock frequency outputted from the oscillator 42 is continuously tuned by the first control signal with different level, and then the tuned variable clock frequency is transmitted back to the first frequency calibration device 40 for perform the same process as aforementioned, and so on and so forth until the variable clock frequency outputted from the oscillator 42 is tuned to reach a first clock frequency conforming with the interval time of the SOF periodic signal.

For example, when the frequency error detector 408 determines that the working count value is different to the predetermined goal count value, it means the variable clock frequency being transmitted from the oscillator 42 is larger or smaller than the interval time of the SOF periodic signal. At this time, the frequency error detector 408 changes the level of the first control signal so as to vary the variable clock frequency transmitted from the oscillator 42 and simultaneously fix one of levels of the second control signal capable of disabling the second frequency calibration device 46. Then, the varied clock frequency is transmitted back from the oscillator 42 to the first frequency calibration device 40 for the same comparing processing. On the contrary, when the frequency error detector 408 determines that the working count value is identical to the predetermined goal count value, it means that the variable clock frequency transmitted from the oscillator 42 is calibrated to reach the first clock frequency which is close to or identical to the interval time of the SOF periodic signal (i.e. the first-stage resolution calibration is accomplished). At this time, the frequency error detector 408 can fix the output level of the first control signal so as to maintain the variable clock frequency transmitted from the oscillator 42 to be the first clock frequency, and simultaneously vary the output level of the second control signal to enable the second frequency calibration device 46.

Figure 5:
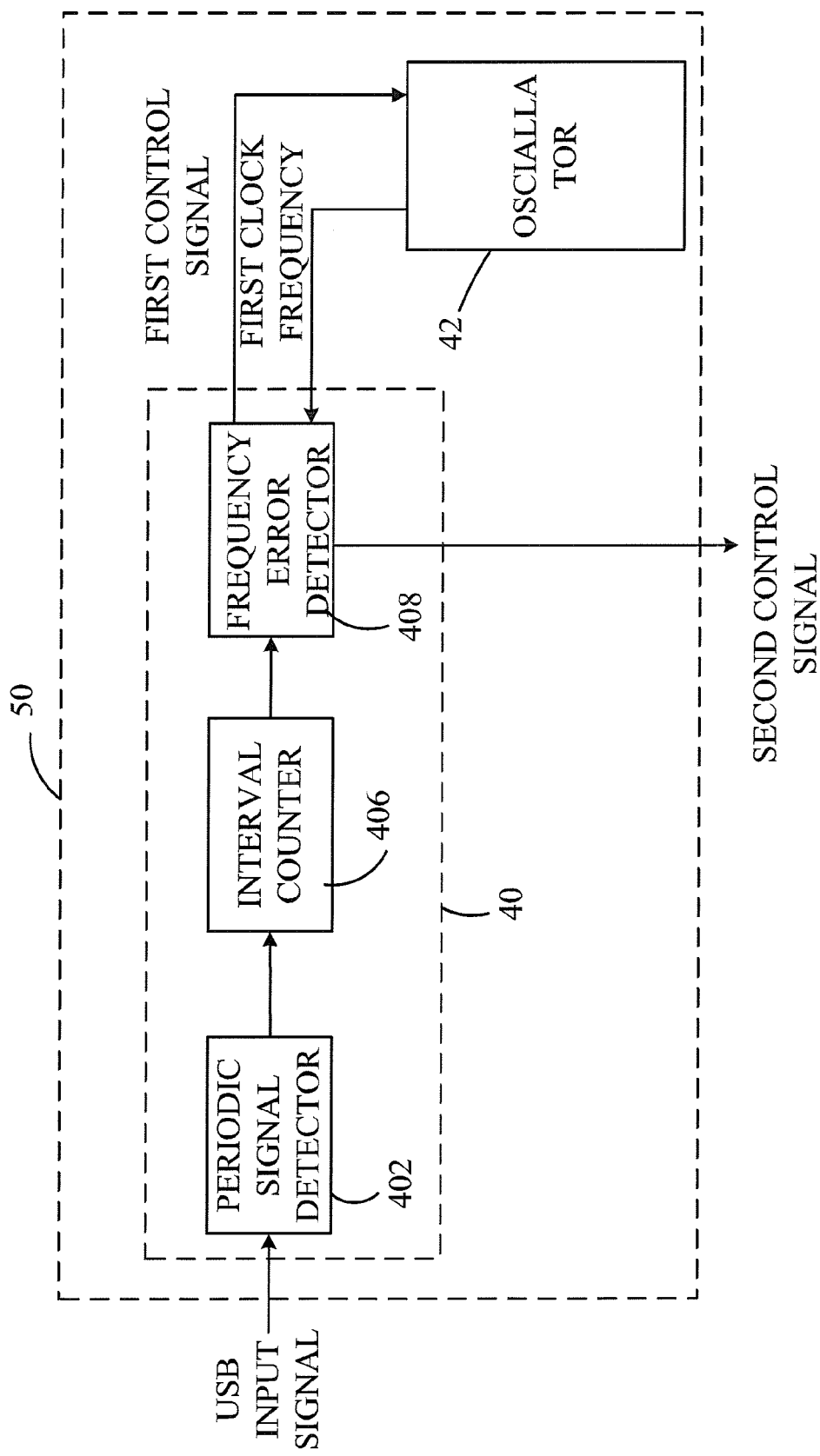
FIG. 5 is a functional block diagram showing a first-stage frequency acquisition loop of the serial bus clock frequency calibration system according to the first preferred embodiment of the present invention.

Accordingly, referring to FIGS. 4 and 5, the first frequency calibration device 40 and the oscillator 42 substantially constitute a first-stage frequency acquisition loop 50. The first-stage frequency acquisition loop 50 sets up a first frequency tuning range of the oscillator 42, according to the first control signal transmitted from the first frequency calibration device 40, so as to calibrate the variable clock frequency outputted from the oscillator 42 to reach the first clock frequency. In the present embodiment, the first control signal substantially are composed of a set of level-variable digital switch signals BCS[0]~BCS[N] (referring to FIG. 7A and FIG. 7B) which can be implemented as control parameters for the oscillator 42. Thus, when the frequency error detector 408 fixes or varies the output level of the first control signal, it means the frequency error detector 408 maintains the output level of the digital switch signals BCS[0]~BCS[N] or varies the output level of at least one of the digital switch signals so as to set up the first frequency tuning range of the oscillator 42.

Turning to FIG. 4 with respect to the present embodiment, the second frequency calibration device 46 comprises a phase detector (PD) 462 (or a frequency detector, FD), a loop filter 466 and a frequency divider 468, wherein the PD 462 is enabled by the second control signal transmitted from the first frequency calibration device 40 to treat the frequency of the USB input signal as a reference clock frequency and determine if there is a phase or edge difference between the reference clock frequency and the variable clock frequency calibrated from the first clock frequency and transmitted from the oscillator 42 (or a divided clock frequency transmitted from the frequency divider 468) is matched so that an upward indicator signal or a downward indicator signal will be generated sending to the loop filter 466, which indicates the variable clock frequency calibrated from the first clock frequency and transmitted from the oscillator 42 being ahead or lagged relative to the reference clock frequency. In the present embodiment, the loop filter 466 may be a low pass filter and is configured to accumulate the phase of the upward indicator signal or the downward indicator signal and accordingly generate a third control signal with different level so as to continuously tune the variable clock frequency from the first clock frequency to reach a second clock frequency. Then, the variable clock frequency tuned from the first clock frequency is transmitted back from the oscillator 42 to the second frequency calibration device 46 for performing the same process as aforementioned, and so on and so forth. Until the variable clock frequency outputted from oscillator 42 and tuned from the first clock frequency reaches the second clock frequency conforming with the reference clock frequency, the loop filter 466 fixes the corresponding level of the third control signal for maintaining such a variable clock frequency outputted from the oscillator 42 and tuned from the first clock frequency to be the required second clock frequency. In the present embodiment, the third control signal may be an analog voltage signal (Vc). The frequency divider 468 may be an integer divider or a fractional divider and is configured to receive the variable clock frequency transmitted from the oscillator 42 and tuned from the first clock frequency, and generate the divided clock frequency to the PD 462. In other embodiments of the present invention, the second frequency calibration device 46 may further comprise a charge pump (not shown) connected between the PD 462 and loop filter 466, depending on an actual demand, and thereby generate a current to charge the loop filter 466 according to the upward indicator signal or the downward indicator signal of the PD 462.

Figure 6:
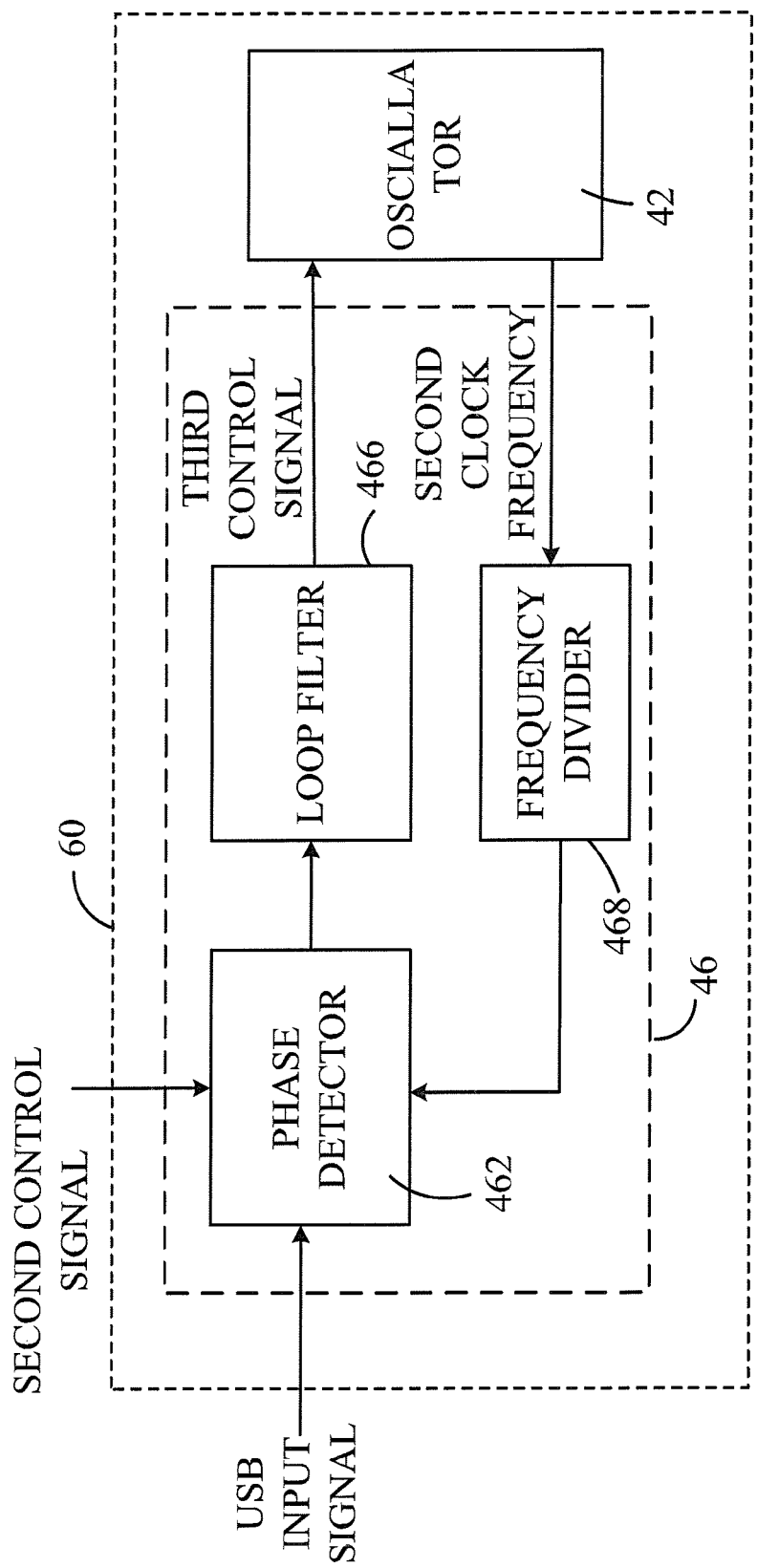
FIG. 6 is a functional block diagram showing a second-stage frequency acquisition loop of the serial bus clock frequency calibration system according to the first preferred embodiment of the present invention.

As described above, referring to FIG. 4 and FIG. 6, the second frequency calibration device 46 and the oscillator 42 substantially constitute a second stage frequency acquisition loop 60 which may be a phase lock loop or a frequency lock loop. At the same time when the first-stage resolution calibration is accomplished with acquirement of the first clock frequency, the PD 462 of the second stage frequency acquisition loop 60 is enabled by the second control signal to start performing the next calibration based on the first clock frequency outputted from the oscillator 42, and the loop filter 466 outputs the third control signal to set up a second frequency tuning range of the oscillator 42, different from the first frequency tuning range, until the variable clock frequency outputted from the oscillator 42 is tuned from the first clock frequency to reach the second clock frequency approaching the reference clock frequency. Then, the second frequency calibration device 46 fixes the variable clock frequency outputted from the oscillator 42 and tuned from the first clock frequency to be the second clock frequency. The first frequency tuning range is larger than the second frequency tuning range. It is because that firstly the first-stage frequency acquisition loop 50 executes a coarsely tuning for the variable clock frequency outputted from the oscillator 42, and then the second stage frequency acquisition loop 60 executes a following finely tuning for the variable clock frequency that has been coarsely tuned. Therefore, an optimum frequency resolution can be achieved. Since the first frequency calibration device 40 and the second frequency calibration device 46 both share the same output frequency of the oscillator 42, the second stage frequency acquisition loop 60 can use an existing phase lock loop or frequency lock loop to lower cost. It notes that the first and second-stage frequency acquisition loops 50, 60 shown in FIGS. 5 and 6 are set in sequences to individually tune the variable clock frequency outputted from the oscillator 42, rather than simultaneously tuning the variable clock frequency outputted from the oscillator 42.

Figure 7A:
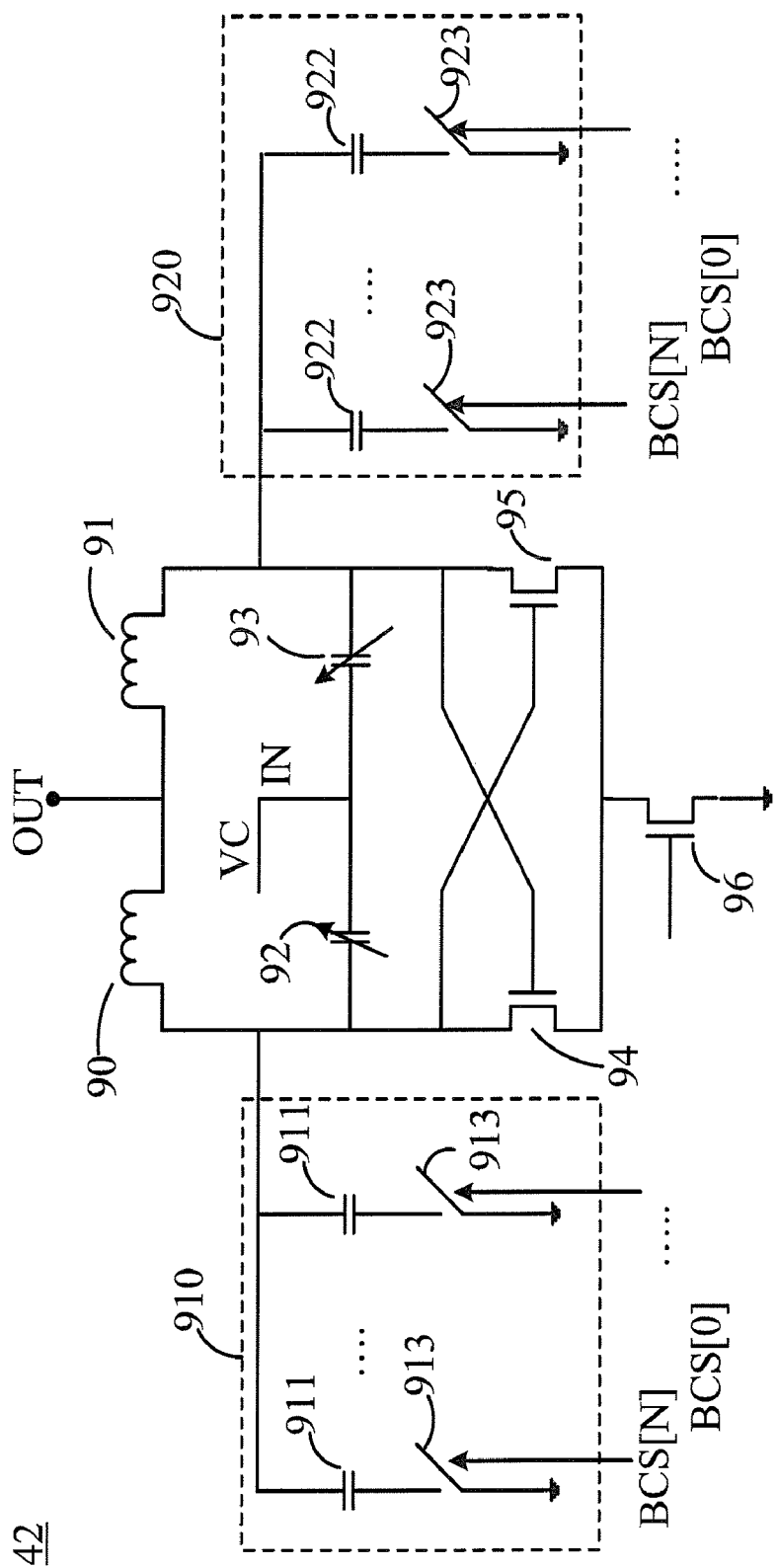
FIG. 7A is a functional block diagram showing an oscillator circuit of the serial bus clock frequency calibration system according to the first preferred embodiment of the present invention.

Further referring to FIG. 4 and FIG. 7A, the oscillator 42 according to one embodiment of the present invention is presented herein, which may be an LC voltage-controlled oscillator (LC-VCO) including at least one output terminal (Out) configured to output variable clock frequency, a tuning terminal (In) configured to receive the third control signal (Vc), a pair of NMOS devices 94 and 95, a NMOS device 96, two inductances 90 and 91 respectively disposed at both sides of the output terminal (Out), two variable capacitors 92 and 93 and two capacitor banks 910 and 920. Due to differential characteristic of the LC oscillator, the capacitor bank 920 functions as the same as the other capacitor bank 910. The capacitor banks 910 and 920 are respectively connected to both opposite sides of the output terminal (Out) of the oscillator 42, and each of the capacitor banks 910 and 920 is composed of N+1 capacitors 911 and 922 with different or the same sizes. However, in other embodiments, the number of the capacitor banks of the oscillator 42 is not limited to two and more than one capacitor banks may be disposed at each side of the output terminal (Out) so as to increase different frequency tuning ranges. Furthermore, the size of each of the capacitor banks 910 and 920 may be designed to be binary weighted or unary weighted. Each of the capacitors 911 and 922 is connected to a switch 913, 923, each which may be implemented as a MOS device. Since a frequency tuning range provided by a common LC oscillator is very narrow, the presented invention utilizes the digital control signal to control the capacitor banks 910 and 920 so as to extend the first frequency tuning range of the LC oscillator 42 corresponding to variations of process, voltage and temperature. By the level variations of the digital switch signals BCS[0]~BCS[N] contained in the first control signal transmitted from the frequency error detector 408 of the first frequency calibration device 40, the switches 913 and 923 can be turned on or off so as to vary the variable clock frequency outputted from the oscillator 42. Accordingly, different frequency tuning ranges can be determined. Meanwhile, the two variable capacitors 92 and 93 are respectively connected to both sides of the tuning terminal (In) to vary the capacitances of the variable capacitors 92 and 93, according to the voltage magnitude of the third control signal (Vc) transmitted from the first frequency calibration device 40, so as to finely tune the variable clock frequency outputted from the oscillator 42, and thereby provide a second frequency tuning range. The above-mentioned capacitor banks 910 and 920 and the variable capacitors 92 and 93 can be implemented with usage of various types of capacitors. For example, the capacitor banks 910 and 920 may be implemented with a metal-insulator-metal, (MIM) type capacitors, and the variable capacitors 92 and 93 may be implemented with a PMOS device, CMOS device or a plurality of smaller capacitors where the capacitance is consisted for subdividing the fine tuning.

It is generally understood that an ideal LC-VCO oscillates with $1/(2*\pi*\sqrt{(L*C)})$ frequency. However, due to the impedance of inductance or the loss of substrate, the energy stored in the inductance and the capacitor is easy to dissipate. This would result in stop of the oscillation. Therefore, the present invention provides a pair of intersectional-coupled NMOS devices 94 and 95 to supply energy, which functions as providing the inductance and the capacitor with negative impedance. The NMOS device 96 is configured with a predetermined current source.

Figure 7B:
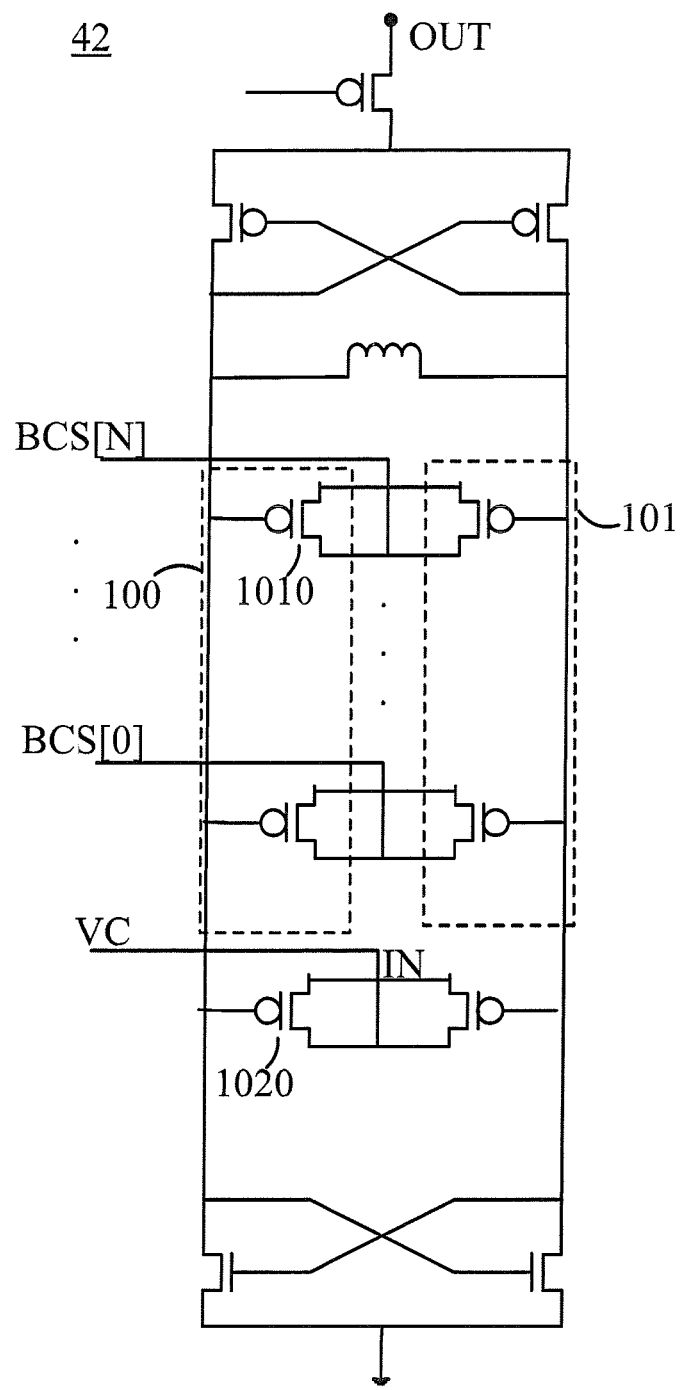
FIG. 7B is a functional block diagram showing an oscillator circuit of the serial bus clock frequency calibration system according to another preferred embodiment of the present invention.

Further referring to FIG. 4 and FIG. 7B, an oscillator 42 according to another embodiment of the present invention is presented herein, which is similar to the function and principle of the oscillator 42 illustrated in FIG. 7A, except that usages of the electrical devices including, for example, each capacitor 1010 of one of the capacitor banks 100 and 101 which may be implemented with a PMOS device, and a variable capacitor 1020 connected to one side of the tuning terminal (In), which may also be implemented with a PMOS device.

Figure 8:
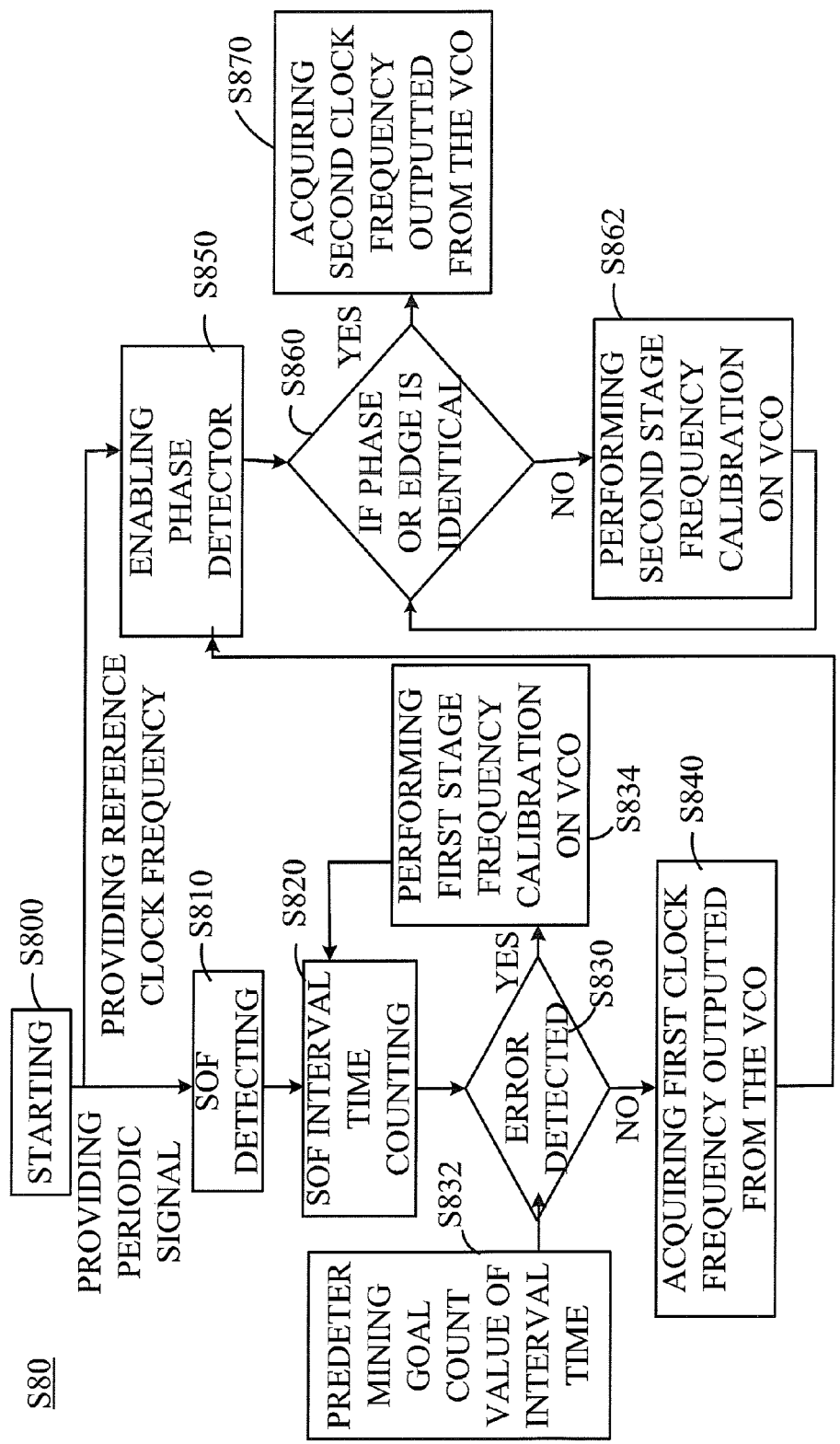
FIG. 8 is a flow diagram showing steps of a serial bus clock frequency calibration method according to a second preferred embodiment of the present invention.

Besides, referring to FIG. 8, a serial bus clock frequency calibration method S80 according to a second preferred embodiment of the present invention is presented herein, with reference to the elements of the serial bus clock frequency calibration system 36 shown in FIG. 4. The method comprises the following steps of:

Step S800, activating or reactivating the USB device to receive a USB input signal transmitted from the USB host, wherein the USB input signal contains at least a SOF periodic signal and a reference clock frequency;

Step S810, using the periodic signal detector of the first frequency calibration device to detect the SOF periodic signal of the USB input signal.

Step S820, using the interval counter of the first frequency calibration device to count the interval time of the SOF periodic signal, according to different variable clock frequency outputted from the oscillator so as to generate a working count value;

Step S830, using the frequency error detector of the first frequency calibration device to compare the working count value with a predetermined goal count value of SOF interval time in a step S832 to determine if there is a frequency error occurring and then generate a first control signal to the oscillator, according to the comparison result, and to generate a second control signal to the second frequency calibration device, wherein If a frequency error occurs, the step S834 is performed; and If the frequency error does not occur, the step S840 is performed;

Step S834, when the working count value is different to the predetermined goal count value, it means that the frequency error occurs, and the level of the first control signal is varied to set up a first-stage frequency tuning range, and a the first-stage frequency calibration is performed on the variable clock frequency of the oscillator, and the output level of the second control signal is fixed so as to disable the second frequency calibration device;

Step S840, when the working count value is identical to the predetermined goal count value, it means that the frequency error does not occur, and the variable clock frequency of the oscillator is tuned to reach a first clock frequency conforming with the interval time between the SOF periodic signals which is acquired by the oscillator, and the output level of the first control signal is fixed so as to maintain the variable clock frequency transmitted from the oscillator to be the first clock frequency, and the output level of the second control signal is varied simultaneously to enable the second frequency calibration device, wherein substantially the first frequency calibration device and the oscillator of the present invention constitute a first-stage frequency acquisition loop to sets up a first frequency tuning range (as performing a frequency coarse tuning) of the oscillator, according to the first control signal, so as to modify the variable clock frequency outputted from the oscillator or maintain the variable clock frequency to be the first clock frequency. Therefore, if the variable clock frequency outputted from the oscillator does not conform with the interval time of the SOF periodic signal, the steps S820, S830 and S834 are performed repeatedly in a loop, until the first clock frequency is acquired. In another embodiment, to avoid an unlimited or overtime loop, it is configured that after the loop is performed for a fixed cycle numbers or a specific time, the present clock frequency outputted from the oscillator 42 is treated as a first clock frequency provided as a working frequency source needed for various components in the USB device 32 (See FIG. 3);

Step S850, then sending the second control signal to enable the phase detector of the second frequency calibration device;

Step S860, the enabled phase detector determining if the phase or edge difference between the reference clock frequency and the variable clock frequency outputted from the oscillator is identical, and then using the loop filter to generate a third control signal to the oscillator according to the determining result so as to modify or maintain the first clock frequency outputted from the oscillator, wherein if the determining result is "no", the step S862 is performed. If the determining result is "yes", the step S870 is performed; and Step S862, varying the output level of the third control signal to set up different second frequency tuning range of the oscillator so as to modify or maintain the variable clock frequency outputted from the oscillator, as performing a second stage frequency calibration (by a frequency fine tuning) on the first clock frequency outputted from the oscillator, and then transmitting the calibrated variable clock frequency back to the second frequency calibration device, wherein the first frequency tuning range is larger than the second frequency tuning range. Substantially, the second frequency calibration device and the oscillator of the present invention constitute a second-stage frequency acquisition loop, which can be enabled by the second control signal to execute the second frequency tuning range according to the third control signal. Therefore, if the variable clock frequency outputted from the oscillator does not conform with the reference clock frequency, the steps S860 and S862 are performed repeatedly in a loop, until the second clock frequency conforming with the reference clock frequency is acquired by the oscillator shown in the step S870. In another embodiment, to avoid an unlimited or overtime loop, it is configured that after the loop is performed for a fixed cycle numbers or a specific time, the present clock frequency outputted from the oscillator 42 is treated as a second clock frequency provided as a working clock frequency source needed for various components in the USB device 32 (See FIG. 3).

Figure 9:
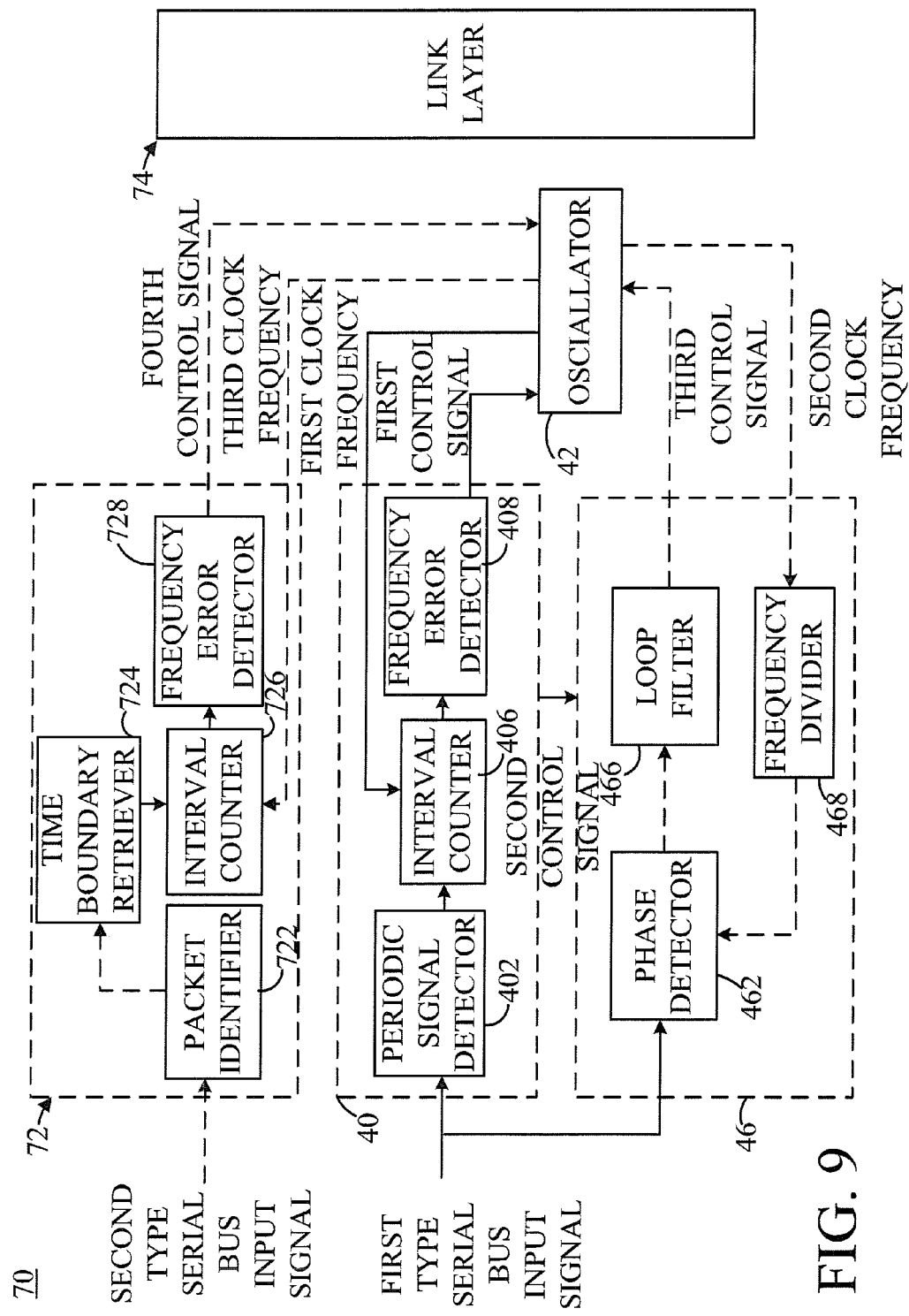
FIG. 9 is a functional block diagram showing the architecture of a serial bus clock frequency calibration system according to a third embodiment of the present invention.

Besides referring to FIG. 9, a serial bus clock frequency calibration system 70 according to a third preferred embodiment of the present invention is introduced hereafter and can be disposed within the USB device 32 as shown in FIG. 3, instead of the serial bus clock frequency calibration system 36 of the first preferred embodiment. For example, the USB device 32 may be a USB hub with a plurality of communication ports standardized in different USB specifications. In the third preferred embodiment, the USB host 30 shown in FIG. 3 may be standardized in USB 2.0 specification but the USB device 32 may be standardized in USB 3.0 specification so as to transmit a USB 2.0-standardized input signal therebetween, as the first type serial bus input signal. In another case, said USB host 30 and USB device 32 both are standardized in USB 3.0 specification but the USB host 30 and USB device 32 are pre-configured to transmit USB 2.0-standardized input signal (as the first type serial bus input signal) therebetween for an initiality of information transmission. After the initiality, the USB host 30 and USB device 32 are pre-configured to succeedingly transmit USB 3.0-standardized input signal (as the second type serial bus input signal) therebetween for further data transmission (detailed later).

Further referring to FIG. 9, the serial bus clock frequency calibration system 70 according to the third preferred embodiment of the present invention primarily comprises: a first frequency calibration device 40, a second frequency calibration device 46, a third frequency calibration device 72, an oscillator 42 and a link layer 74, wherein since the first and second frequency calibration devices 40, 46 and the oscillator 42 all are the same as described by the first preferred embodiment shown in FIGS. 4, 7A and 7B in both structure and function, and respectively constitute the same as the first and second stage frequency acquisition loops 50, 60 shown in FIGS. 5 and 6 and therefore are omitted herein.

As shown in FIGS. 3 and 9, when the USB host 30 and USB device 32 are electrically connected with each other for an initiality of information transmission therebetween, the USB host 30 firstly transmits a detecting signal to the link layer 74 of the serial bus clock frequency calibration system 70 of the USB device 32 to make sure of the occurrence and connection of the device 32. Then both sides proceed to a handshaking stage, wherein the link layer 74 of the USB device 32 determines what kind of communication protocol mode such as USB 2.0 or USB 3.0 is adopted between the USB device 32 and the USB host 30. After determining a communication protocol mode between the USB device 32 and the USB host 30, the link layer 74 can further determine usage of the first frequency calibration device 40 to receive the first type serial bus input signal or usage of the third frequency calibration device 72 to receive the second type serial bus input signal, under the determined communication protocol mode. For example, if the USB host 30 and USB device 32 all support USB 3.0 specification, the initality of electrical connection between the USB host 30 and USB device 32, such as the handshaking stage, consists of two steps. In a first step, the link layer 74 firstly determines that the communication protocol mode between the USB host 30 and USB device 32 is USB 2.0, and accordingly responds to the USB host 30 so that the USB host 30 inactivates its super-speed signal operation standardized in USB 3.0 specification. By following, the link layer 74 determines first usage of the first frequency calibration device 40 to receive the first type serial bus input signal transmitted from the USB host 30 for performing the first-stage first type serial bus frequency calibration.

Figure 13:
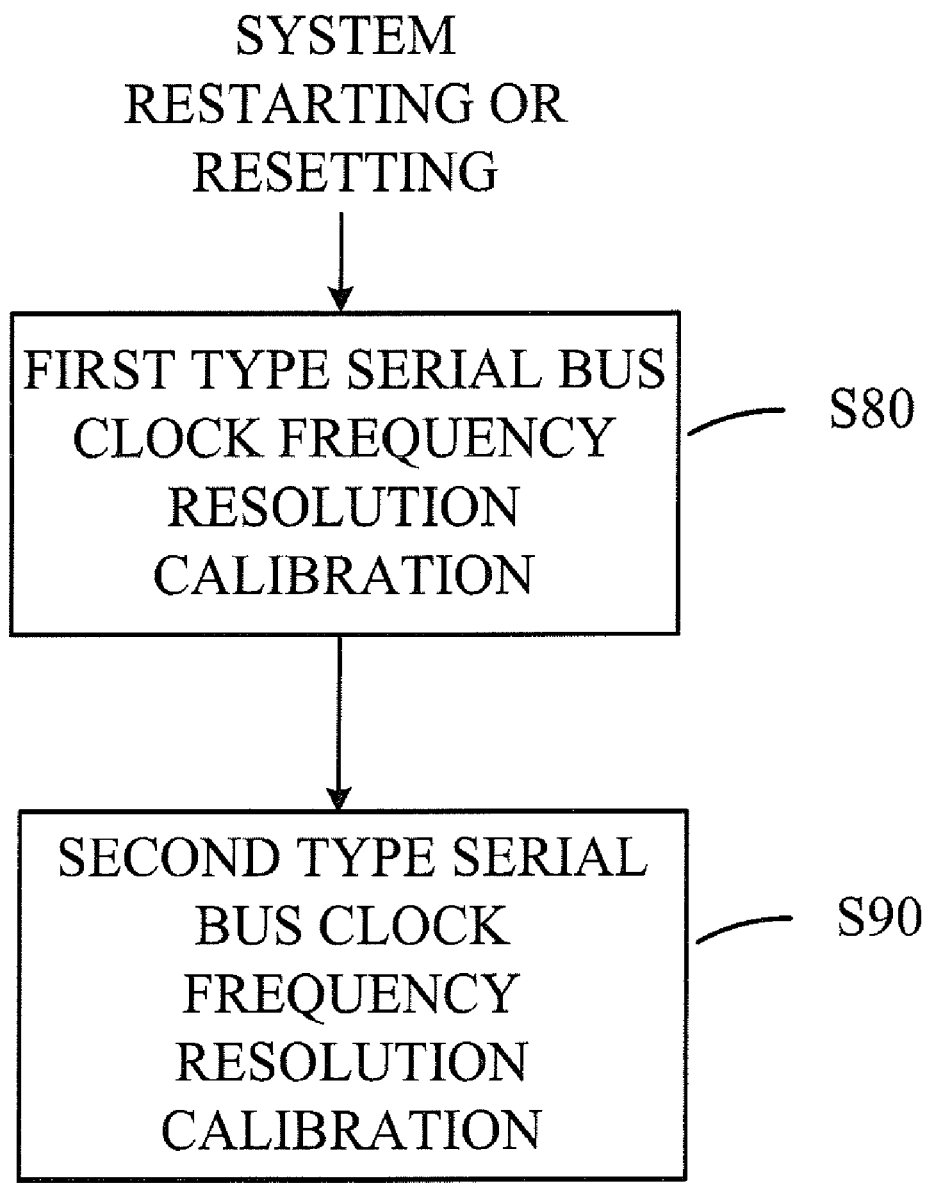
FIG. 13 is a flow diagram showing a serial bus clock frequency calibration method according to a fourth preferred embodiment of the present invention.

After the first frequency calibration device 40 accomplishes said first-stage first type serial bus frequency calibration, the link layer 74 changes again the communication protocol mode between the USB host 30 and USB device 32 to be USB 3.0, and then determines usage of the third frequency calibration device 72 to receive the second type serial bus input signal transmitted from the USB host 30, and thereby succeeds to the other step for calibration of the second type serial bus clock frequency resolution (as shown in FIG. 13), based on a calibration result of the first type serial bus clock frequency resolution.

In the third embodiment, when the link layer 74 determines the communication protocol mode between the USB host 30 and USB device 32 to be USB 2.0, the first frequency calibration device 40 is utilized by the link layer 74 to receive the first type serial bus input signal, wherein since the first type serial bus input signal contains at least one periodic signal (such as a SOF packet) and a reference clock frequency, the first frequency calibration device 40 generates a first control signal, based on the at least one periodic signal (such as SOF packet) and the variable clock frequency outputted from the oscillator 42, so as to set up a first frequency tuning range (such as 5000 ppm) of the oscillator 42 and then continuously tune the variable clock frequency outputted from the oscillator 42, until achieving a first clock frequency conforming with the interval time between said SOF periodic signals and generating a second control signal. Please further refer to FIG. 11, which shows a relative schematic diagram introducing a relationship between a sampled time "Ts1" and the first type serial bus input signal, wherein a symbol "SOF" denote each periodic signal (as the SOF packet) contained in the first type serial bus input signal; and a symbol "T1" denotes an interval time between each two periodic signals. After the first frequency calibration device 40 employs the variable clock frequency outputted from the oscillator 42 to a count up a working count value of the interval time "T1" between the periodic signals "SOF" for a specific period, the first frequency calibration device 40 compares the working count value with a predetermined goal count value to make a difference determination, and by the comparing result determines whether not or to generate a first control signal set up the first frequency tuning range of the oscillator 42, until achieving a first clock frequency conforming with the interval time "T1" between the periodic signals "SOF".

In the third embodiment, when the second frequency calibration device 46 is enabled by said second control signal, the first frequency calibration device 40 stops working, i.e. stopping tuning the variable clock frequency outputted from the oscillator 42, and the second frequency calibration device 46 starts to receive the reference clock frequency of the first type serial bus input signal and then generates a third control signal, based on the phase or edge difference between the reference clock frequency and the variable clock frequency outputted from the oscillator 42, so as to set up a second frequency tuning range (such as 500 ppm) of the oscillator 42 and then continuously tune the variable clock frequency outputted from the oscillator 42, until achieving a second clock frequency approaching said reference clock frequency. Since the first frequency tuning range is larger than the second frequency tuning range, the second stage frequency acquisition loop 60 can achieve a higher clock frequency resolution than the first-stage frequency acquisition loop 50 (as shown in FIGS. 5 and 6) done. When the second frequency calibration device 46 achieves the second clock frequency approaching the reference clock frequency, it means the two-stage first type serial bus clock frequency resolution calibration process for the oscillator 42 is accomplished. Please be noted that the first and second stage frequency acquisition loops 50, 60 shown in FIG. 5 and FIG. 6 are configured in sequences calibrating the variable clock frequency outputted from the oscillator 42 but both the loops 50, 60 cannot simultaneously tune the variable clock frequency outputted from the oscillator 42.

In the third embodiment, after achieving the second clock frequency approaching the reference clock frequency, the second frequency calibration device 46 transmits a signal to inform the link layer 74 so that the link layer 74 electrically disconnects with the host 30 and returns to detection. Then, the communication protocol mode between the USB host 30 and USB device 32 is re-determined as switched from USB 2.0 to USB 3.0 so that the link layer 74 determines the usage of the third frequency calibration device 72 to start receiving the second type serial bus input signal transmitted from the USB host 30, and based on the result of calibrating the first type serial bus clock frequency resolution, a second type serial bus clock frequency resolution calibration processed in the next stage proceeds. It notes that after the link layer 74 determines switch of the communication protocol mode to USB 3.0, the USB device 32 is configured unable to receive the first type serial bus input signal as standardized in USB 2.0.

Besides, in another embodiment, to avoid the second stage frequency acquisition loop 60 performing an unlimited or overtime loop, it is configured that after the loop is performed with usage of a counter for a fixed cycle numbers or a specific time, the counter sends a signal to inform the link layer 74 so that the link layer 74 switches the communication protocol mode from USB 2.0 to USB 3.0 and treats the present clock frequency outputted from the oscillator 42 as a second clock frequency calibrated as a working frequency source needed for various components in the USB device 32 (See FIG. 3);

Besides, in another embodiment, the ink layer 74 presets a specific performing time when the communication protocol mode is used in USB 2.0. As soon as the performing time is out, the link layer 74 switches the communication protocol mode from USB 2.0 to USB 3.0 and treats the present clock frequency outputted from the oscillator 42 as a second clock frequency calibrated.

Figure 12:
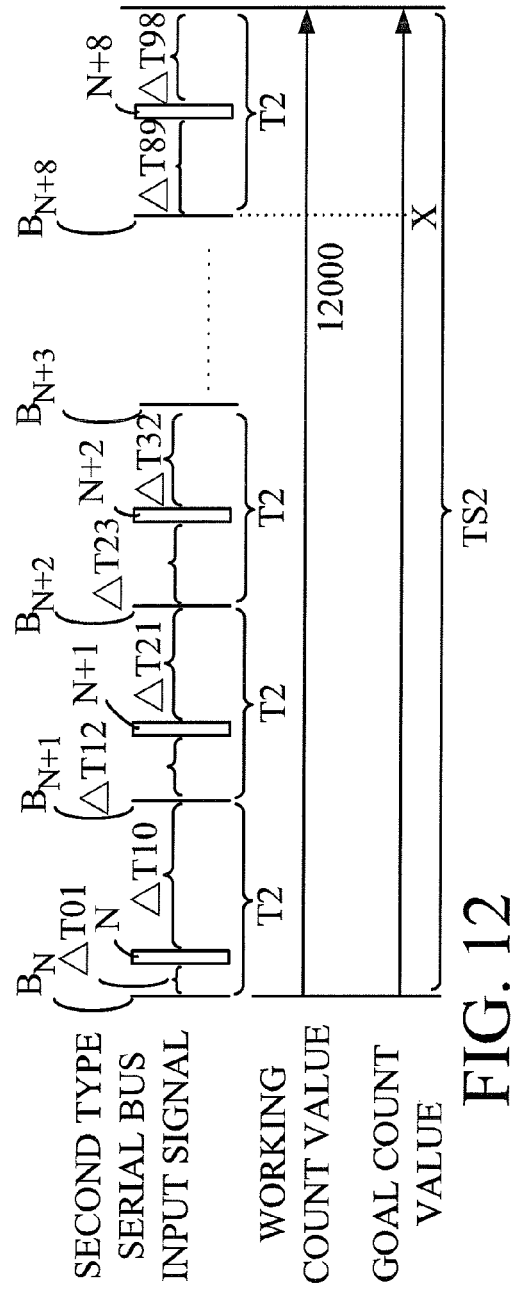
FIG. 12 is a relative schematic diagram between a sampling time "Ts2" and the second type serial bus input signal.

Referring to FIGS. 9 and 12 illustrating the third embodiment, the third frequency calibration device 72 is configured to receive the second type serial bus input signal and comprises: a packet identifier 722, a time boundary retriever 724, an interval counter 726 and a frequency error detector 728.

The packet identifier 722 is configured to identify at least one specific packet such as an Isochronous Timestamp Packet (ITP) from the second type serial bus input signal and further achieves an time information, as a time stamp for recording a bus interval time information, contained in the at least one specific packet. Please further refer to FIG. 12 illustrating a relative schematic diagram, which introduces a relationship between a sampled time "Ts2" and the second type serial bus input signal, wherein a symbol "ITP" denotes each ITP packet contained in the second type serial bus input signal. In the third embodiment, the packet identifier 722 can sample and identifies each one of a plurality of serial ITP packets from the second type serial bus input signal for the sampled time "Ts2". In another embodiment, the packet identifier 722 also can sample and identifies only one of the ITP packets from the second type serial bus input signal for the sampled time "Ts2".

The time boundary retriever 724 is configured to recover a previous time boundary neighbored on the interval time when each one of specific packets belongs, based on said time information transmitted from the packet identifier 722, which records a relative time difference between the each specific packet and the previous time boundary relative to the each specific packet. Please further refer to FIG. 12 illustrating a relative schematic diagram, which introduces a relationship between a sampled time "Ts2" and the second type serial bus input signal, wherein a symbol "T2" denotes an interval time when each one of specific packets belongs in the second type serial bus input signal; those symbols "$B_N$", "$B_{N+1}$", "$B_{N+2}$", ... "$B_{N+8}$" denote a previous time boundary neighbored on the interval time "T2" when each one of the plurality of serial ITP packets belongs for the sampled time "Ts2"; those symbols "☐t01", "☐t12", "☐t23", ... "☐t89" denote a relative time difference between the each specific packet and the previous time boundary "$B_N$", "$B_{N+1}$", "$B_{N+2}$", ... "$B_{N+8}$" neighbored on the interval time "T2" when the each specific packet belongs. In the third embodiment, only based on a time information contained in at least one specific ITP packet (such as the $N^{th}$ ITP packet for the sampled time "Ts2"), which records a relative time difference "☐t01" between the specific $N^{th}$ ITP packet and the previous time boundary "$B_N$" neighbored on the interval time "T2" when the specific $N^{th}$ ITP packet belongs, the time boundary retriever 724 can recover the previous time boundary "$B_N$" neighbored on the interval time "T2" when the specific $N^{th}$ packet belongs. In another embodiment, also based on a time information contained in at least one specific ITP packet (such as the $N^{th}$ ITP packet for the sampled time "Ts2"), which recodes a relative time difference "☐t10" between the specific $N^{th}$ ITP packet and the next time boundary "$B_{N+1}$" neighbored on the interval time "T2" when the specific $N^{th}$ ITP packet belongs, the time boundary retriever 724 can recover the next time boundary "$B_{N+1}$" neighbored on the interval time "T2" when the specific $N^{th}$ packet belongs. And so on and so forth, during the sampled time "Ts2", for example, the time boundary retriever 724 can successively utilize a relative time difference "☐t89" or "☐t98" recoded in the time information contained within the specific $(N+8)^{th}$ ITP packet to recover the previous time boundary "$B_{N+8}$" neighbored on the interval time "T2" when the specific $(N+8)^{th}$ packet belongs.

The interval counter 726 based on the time boundary (as "$B_N$", "$B_{N+1}$") recovered by the time boundary retriever 724 for the specific ITP packets, employs the variable clock frequency outputted from the oscillator 42 to calculate a count difference from the recovered time boundary (e.g. "$B_N$") of the interval time when one of the specific ITP packets belongs to another recovered time boundary (e.g. "$B_{N+8}$") of the interval time when another specific ITP packet belongs. Such a count difference will be treated as a working count value. Please refer to FIG. 12 illustrating an exemplar, wherein the sampled time "Ts2" is determined to 1 ms and the sampled second type serial bus input signal contains nine ITP packets (e.g. "N", "N+1", "N+2", . . . "N+8"), whereby the interval time "T2" when each one of ITP packets belongs all is 125 μs (as 1 ms/8). The time boundary retriever 724 has found the specific $N^{th}$ ITP packet, the previous time boundary "$B_N$" of the interval time "T2" when the specific $N^{th}$ ITP packet belongs, the specific $(N+8)^{th}$ ITP packet, the previous time boundary "$B_{N+8}$" of the interval time "T2" when the specific $(N+8)^{th}$ ITP packet belongs. Accordingly, the interval counter 726 can employ the variable clock frequency, such as 12 MHz, outputted from the oscillator 42 to count up a count difference of 12,000 times from the recovered time boundary (e.g. "$B_N$") of the interval time when the specific $N^{th}$ ITP packet belongs to another recovered time boundary (e.g. "$B_{N+8}$") of the interval time when another specific $(N+8)^{th}$ ITP packet belongs. Then, the count difference of 12,000 times would be treated as a working count value.

The frequency error detector 728, according to a comparing result between said working count value provided from the interval counter 726 and a predetermined goal count value, generates a fourth control signal, wherein if the working count value and the predetermined goal count value are unmatched, the frequency error detector 728 of the third frequency calibration device 72 will modify an output level of the fourth control signal to vary the variable clock frequency outputted from the oscillator 42; on the contrary, if the working count value and the predetermined goal count value are matched, the frequency error detector 728 of the third frequency calibration device 72 will fix the output level of the fourth control signal to maintain the variable clock frequency outputted from the oscillator 42. With reference to the exemplar shown in FIG. 12, if the working count value is 12,000 times but the predetermined goal count value "X" is larger or smaller than the working count value of 12,000 times, the frequency error detector 728 of the third frequency calibration device 72 will transmit the fourth control signal with an output level to tune laggardly or ahead the variable clock frequency outputted from the oscillator 42. After that, the varied clock frequency outputted from the oscillator 42 is fed back to the interval counter 726 of the third frequency calibration device 72 for returning to count up the working count value, and so and so forth, until the working count value is identical to or approaches the predetermined goal count value, whereby a third clock frequency conforming with the interval times when the at least one specific packet corresponds is achieved for a working frequency source needed for various components in the USB device 32 (See FIG. 3). However, in another embodiment, to avoid an unlimited or overtime loop, it is configured that after the loop is performed with usage of a counter for a fixed cycle numbers or a specific time, the present clock frequency outputted from the oscillator 42 is treated as a third clock frequency.

Further referring to FIGS. 9 and 7A, the third frequency calibration device 72 of the serial bus clock frequency calibration system 70 according to the third embodiment of the present invention, which transmits the fourth control signal functioning as the same control principle as the first control signal of said first embodiment, by digital control signals controlling the capacitor banks 910, 920 to set up the third frequency tuning range (such as 300 ppm) of the oscillator 42. It means that by the level variations of a set of digital switch signals BCS[0]~BCS[N] contained in the fourth control signal transmitted from the frequency error detector 728 of the third frequency calibration device 72, the switches 913 and 923 of the oscillator 42 can be turned on or off so as to vary the clock frequency level outputted from the oscillator 42. In another embodiment, the fourth control signal transmitted from the third frequency calibration device 72 may be a voltage signal (Vc). By the different level of the voltage signal (Vc), the capacitances of the variable capacitors 92 and 93 can be varied, so as to further finely tune the variable clock frequency from the oscillator 42. The above-mentioned capacitor banks 910 and 920 and the variable capacitors 92 and 93 can be implemented with various types of capacitors. For example, the capacitor banks 910 and 920 may be implemented with a metal-insulator-metal (MIM) type capacitors, and the variable capacitors 92 and 93 may be implemented with a PMOS device, CMOS device or a plurality of smaller capacitors where the capacitance is consisted for subdividing the fine tuning.

Further referring to FIGS. 9 and 7B, an oscillator 42 according to another embodiment of the present invention is presented herein, which is similar to the function and operating principle of the oscillator 42 illustrated in FIG. 7A, except that usages of the electrical devices Including, for example, each capacitor 1010 of either of the capacitor banks 100 and 101 which may be implemented with a PMOS device, and a variable capacitor 1020 connected to one side of the tuning terminal (In), which may also be implemented with a PMOS device.

As aforementioned, when receiving the second type serial bus input signal, the third frequency calibration device 72 generates the fourth control signal, based on the time information contained in the at least one specific packet of the second type serial bus input signal and the variable clock frequency outputted from the oscillator 42, to set up a third frequency tuning range such as 300 ppm of the oscillator 42 so as to vary the variable clock frequency outputted from the oscillator 42. Then, the varied clock frequency is fed back to the third frequency calibration device 72, and so on and so forth, so that the third frequency calibration device 72 and the oscillator 42 substantially constitute a third-stage frequency acquisition loop 102 shown in FIG. 10, which continuously varies or maintains the variable clock frequency outputted from the oscillator 42 until achieving a third clock frequency conforming with the interval time when the at least one specific packet corresponds. In another embodiment, a counter count can be used to count up a fixed cycle numbers of or a specific time when the third-stage frequency acquisition loop 102 is performed, the present clock frequency outputted from the oscillator 42 is treated as a third clock frequency. However, it notes that first, second and third stage frequency acquisition loops 50, 60, 102 shown in FIGS. 5, 6 and 10 all are configured in sequences calibrating the clock frequency outputted from the oscillator 42 but the loops 50, 60, 102 are configured unable to simultaneously tune the variable clock frequency outputted from the oscillator 42.

Besides referring to FIG. 13, a serial bus clock frequency calibration method according to a fourth preferred embodiment of the present invention is presented herein, with reference to the elements of the serial bus clock frequency calibration system 70 shown in FIG. 9. The method comprises the following steps of:

utilizing a link layer 74 to determine either the first frequency calibration device 40 to receive the first type serial bus input signal or the second frequency calibration device 72 to receive the second type serial bus input signal;

step S80 (see the steps of FIG. 8), if the first frequency calibration device 40 is determined to receive the first type serial bus input signal, performing a two-stage first type serial bus clock frequency resolution calibration process to respectively set up the first frequency tuning range and the second frequency tuning range of the oscillator 42 so as to achieve the first clock frequency and second clock frequency required, wherein the first frequency tuning range is larger than the second frequency tuning range; and step S90, after accomplishing the two-stage first type serial bus (as standardized in USB 2.0 specification) clock frequency resolution calibration process, performing a second type serial bus (as standardized in USB 3.0 specification) clock frequency resolution calibration process (detailed later). Between said steps S80 and S90, after the second frequency calibration device 46 achieves a second clock frequency approaching said reference clock frequency as described in the step S870 of FIG. 8, the second frequency calibration device 46 transmits a signal to inform the link layer 74 so that the link layer 74 electrically disconnects with the USB host 30 and returns to detection. Then the communication protocol mode between the USB host 30 and USB device 32 is switched from USB 2.0 to USB 3.0 so that the link layer 74 determines the usage of the third frequency calibration device 72 to start receiving the second type serial bus input signal transmitted from the USB host 30, and based on the result of calibrating the first type serial bus clock frequency resolution, a second type serial bus clock frequency resolution calibration process proceeds. Besides, in another embodiment, to avoid the second stage frequency acquisition loop 60 performing an unlimited or overtime loop, it is configured that after the loop is performed with usage of a counter for a fixed cycle numbers or a specific time, the counter sends a signal to inform the link layer 74 so that the link layer 74 switches the communication protocol mode from USB 2.0 to USB 3.0 and treats the present clock frequency outputted from the oscillator 42 as a second clock frequency calibrated. Besides, in another embodiment, the ink layer 74 presets a specific performing time when the communication protocol mode is used in USB 2.0. As soon as the performing time is out, the link layer 74 switches the communication protocol mode from USB 2.0 to USB 3.0 and treats the present clock frequency outputted from the oscillator 42 as a second clock frequency calibrated.

Figure 10:
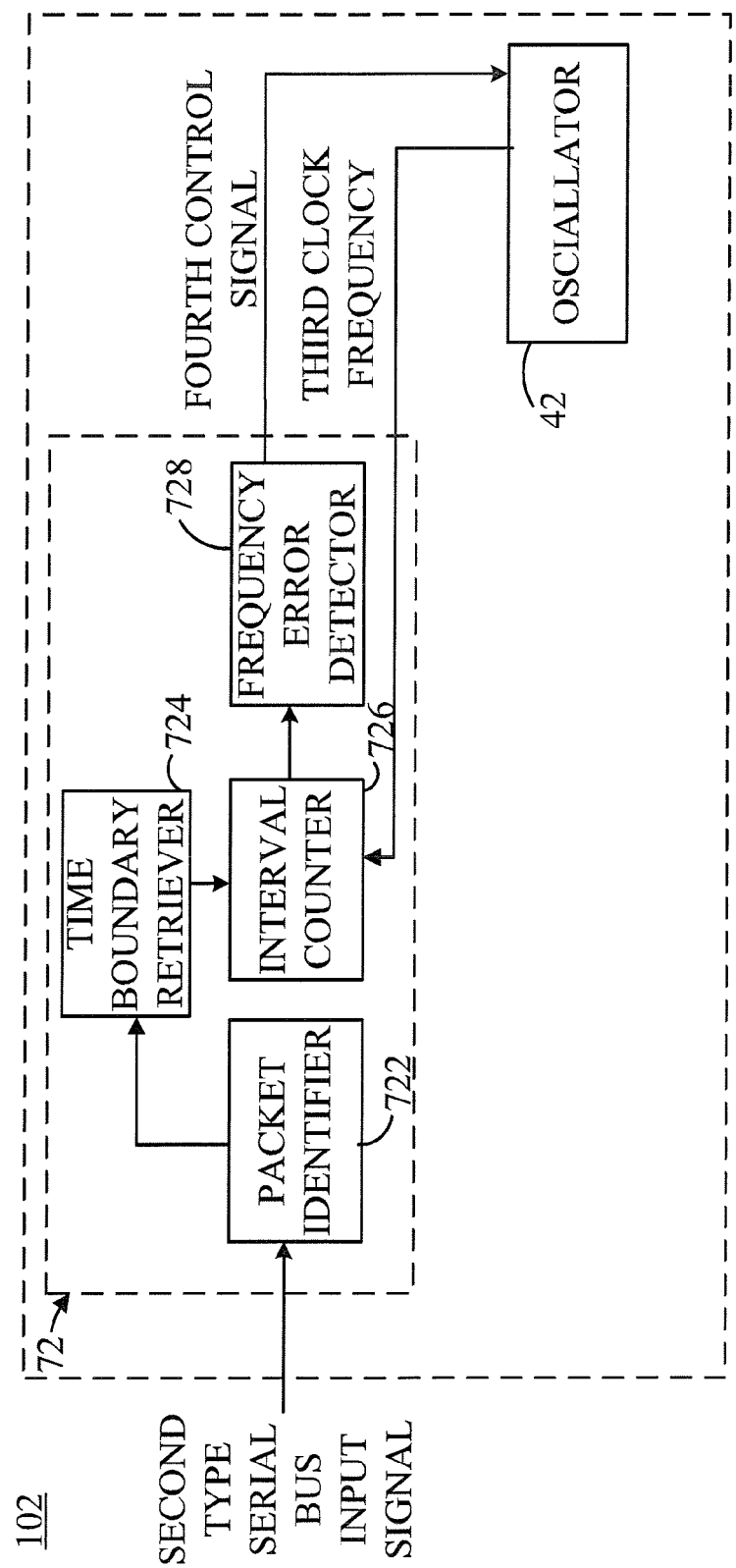
FIG. 10 is a functional block diagram showing a first-stage frequency acquisition loop of the serial bus clock frequency calibration system according to the third embodiment of the present invention.
Figure 11:
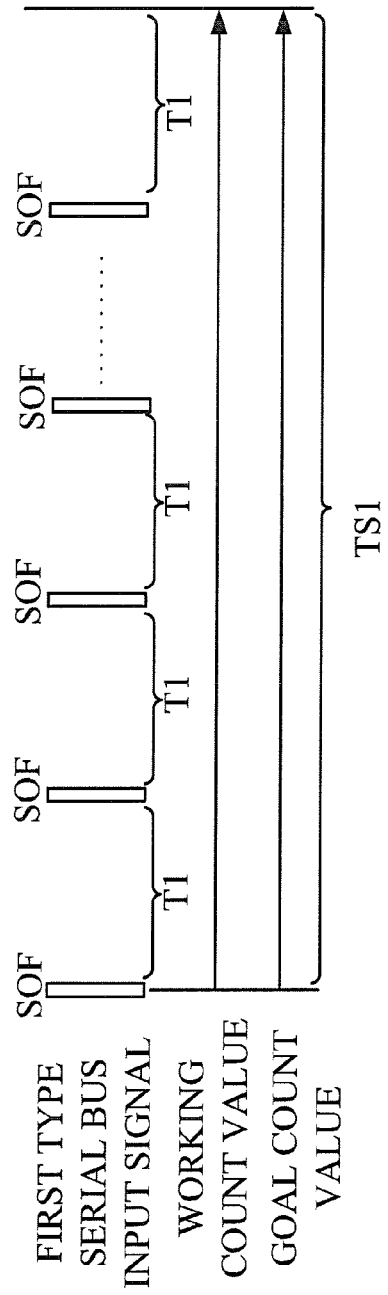
FIG. 11 is a relative schematic diagram between a sampling time "Ts1" and the first type serial bus input signal.
Figure 14:
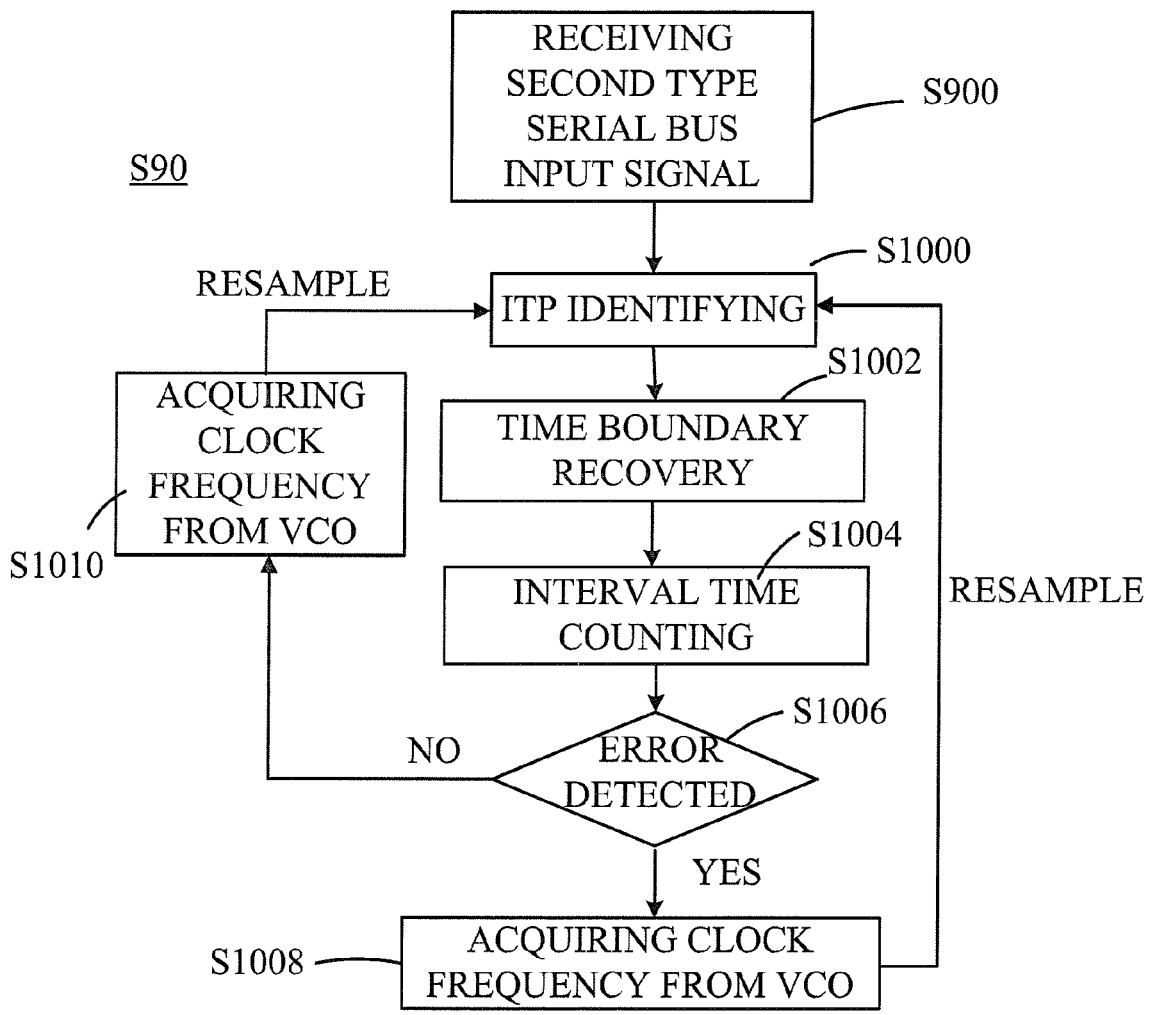
FIG. 14 is a flow diagram showing a second type serial bus clock frequency resolution calibration process shown in FIG. 13.

Besides referring to FIG. 14, said second type serial bus clock frequency resolution calibration process S90 is detailed in stepwise, with reference to the elements of the serial bus clock frequency calibration system 70 shown in FIG. 9. The process S90 comprises the following steps of:

step S900, determining the third frequency calibration device 72 to receive the second type serial bus input signal containing at least one specific ITP packet;

step S1000, utilizing the third frequency calibration device 72 to identify at least one specific ITP packet and a time information contained in the at least one specific ITP packet;

step S1002, using the time information contained in the at least one specific ITP packet to recover each time boundary (e.g. the symbols "$B_N$", "$B_{N+1}$" shown in FIG. 12) of the interval time when the at least one specific ITP packet belongs;

step S1004, using the third frequency calibration device 72 according to the variable clock frequency outputted from the oscillator 42 to calculate a count difference from the recovered time boundary (e.g. "$B_N$" shown in FIG. 12) of the interval time when one of the specific ITP packets belongs to another recovered time boundary (e.g. "$B_{N+8}$" shown in FIG. 12) of the interval time when another specific ITP packet belongs, wherein the count difference will be treated as a working count value;

step S1006, using the third frequency calibration device 72 to compare whether said working count value is different from a predetermined goal count value or not; if so, proceeding to the step S1008; otherwise proceeding to step S1010;

step S1008, the third frequency calibration device 72 based on the comparing result between the working count value and the predetermined goal count value, generating a fourth control signal to set up a third frequency tuning range of the oscillator 42 so as to continuously tune the operation clock frequency outputted from the oscillator 42 and then the tuned operation clock frequency is fed back to the third frequency calibration device 72; and returning to the step S1000 so that the third frequency calibration device 72 returns to sample the second type serial bus input signal. In the fourth embodiment, said third frequency tuning range is smaller than both of the first frequency tuning range and the second frequency tuning range. In step S1008, the third frequency calibration device 72 transmits the fourth control signal to set up a third frequency tuning range of the oscillator 42, whereby the clock frequency outputted from the oscillator 42 is tuned from the second clock frequency by the step S80 as performing the two-stage first type serial bus clock frequency resolution calibration process to reach the third clock frequency; and step S1010, when the working count value is identical to the predetermined goal count value so that a third clock frequency conforming with the interval time boundary where the at least one specific packet corresponds is achieved, fixing the output level of the fourth control signal to maintain the third clock frequency outputted from the oscillator 42, and then coming back to the step S1000 where the third frequency calibration device 72 returns to sample the second type serial bus input signal until the third frequency calibration device 72 achieves the third clock frequency conforming with the interval time boundary where the at least one ITP specific packet corresponds. In another embodiment, the third stage frequency acquisition loop 102 shown in FIG. 10 is performed with usage of a counter for a fixed cycle numbers or a specific time, the present clock frequency outputted from the oscillator 42 is treated as a third clock frequency.

Figure 15:
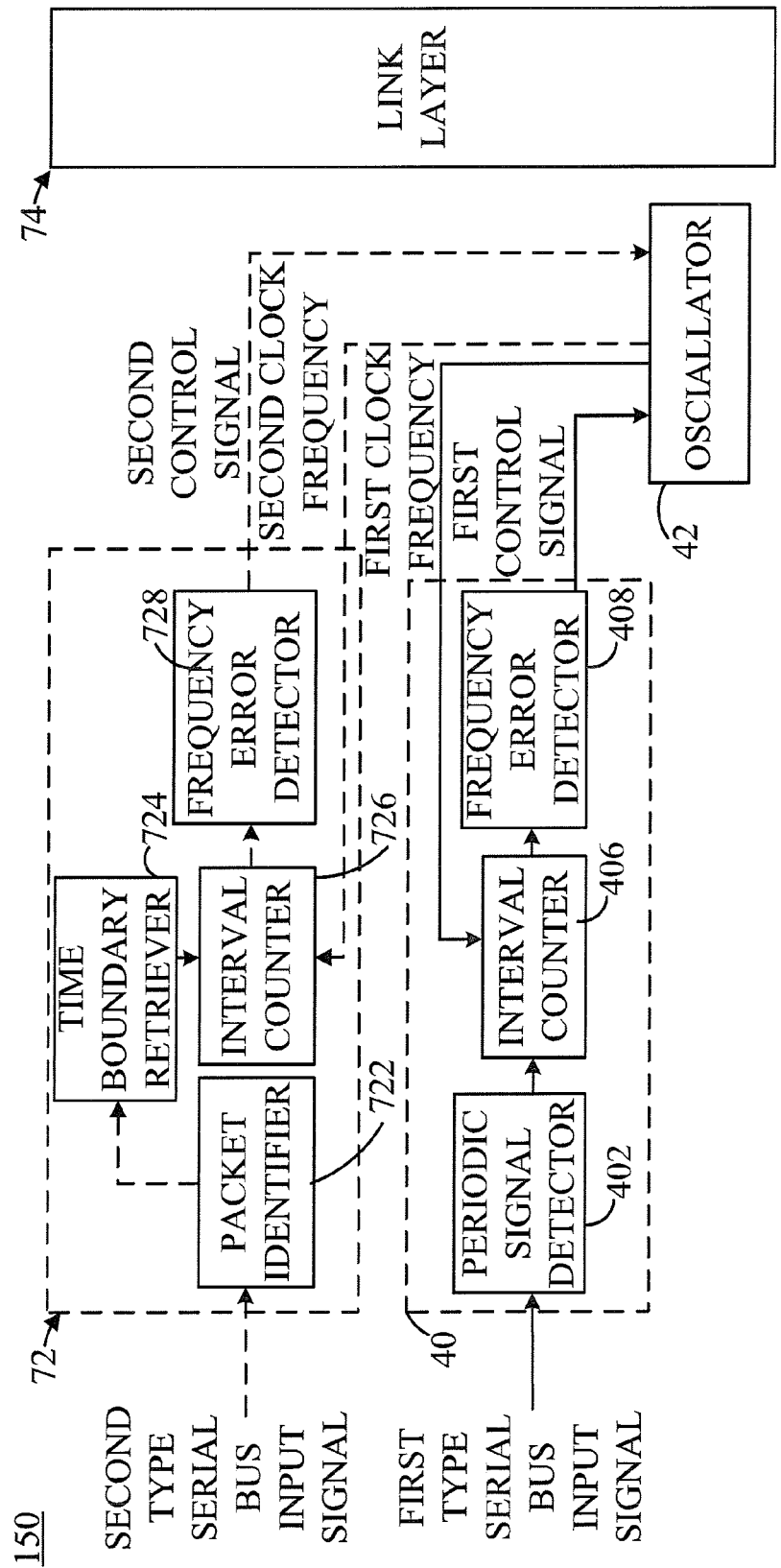
FIG. 15 is a functional block diagram showing a serial bus clock frequency calibration system according to a fifth preferred embodiment of the present invention.

Further referring to FIG. 15, a serial bus clock frequency calibration system 150 according to a fifth preferred embodiment of the present invention primarily comprises: a first frequency calibration device 40, a second frequency calibration device 72, an oscillator 42 and a link layer 74. There are a part of structures as the same as introduced by the third embodiment of FIG. 9. That is, the first frequency calibration device 40, the oscillator 42 and the link layer 74 in the fifth preferred embodiment shown in FIG. 15 all are the same as described by serial bus clock frequency calibration system 70 of the third preferred embodiment shown in FIGS. 9, 7A and 7B in both structure and function. The first frequency calibration device 40 and the oscillator 42 in the fifth preferred embodiment constitute the same as the first stage frequency acquisition loop 50 shown in FIG. 5. Since the second frequency calibration device 72 in the fifth preferred embodiment is the same as the third second frequency calibration device 72 of the third embodiment shown in FIG. 9, the second frequency calibration device 72 and the oscillator 42 in the fifth preferred embodiment constitute a second stage frequency acquisition loop (not labeled) as the same structure and function as the third stage frequency acquisition loop 102 of the third embodiment shown in FIG. 10. Differently from the third embodiment shown in FIG. 9, the fifth preferred embodiment shown in FIG. 15 has not the second frequency calibration device 46 shown in FIG. 9 and the second stage frequency acquisition loop 60 shown in FIG. 6.

When the USB device 32 (shown in FIG. 3) receives a USB input signal if the USB input signal is either the first type serial bus (as standardized in USB 2.0 specification) input signal or the second type serial bus (as standardized in USB 3.0 specification) input signal, the link layer 74 shown in FIG.

15 determines either the first frequency calibration device 40 to receive the first type serial bus input signal or the second frequency calibration device 72 to receive the second type serial bus input signal.

In the fifth embodiment such shown in FIGS. 3, 5 and 15, when the USB host 30 and USB device 32 are electrically connected with each other for an initality of information transmission therebetween, the USB host 30 firstly transmits a detecting signal to the link layer 74 of the serial bus clock frequency calibration system 70 of the USB device 32 to make sure of the occurrence and connection of the device 32. Then both sides proceed to a handshaking stage, wherein the link layer 74 of the USB device 32 determines what kind of communication protocol mode such as USB 2.0 or USB 3.0 is adopted between the USB device 32 and the USB host 30. After determining a communication protocol mode between the USB device 32 and the USB host 30, the link layer 74 can further determine usage of the first frequency calibration device 40 to receive the first type serial bus input signal or usage of the second frequency calibration device 72 to receive the second type serial bus input signal, under the determined communication protocol mode. For example, if the USB host 30 and USB device 32 all support USB 3.0 specification, the initality of electrical connection between the USB host 30 and USB device 32, such as the handshaking stage, consists of two steps. In a first step, the link layer 74 firstly determines that the communication protocol mode between the USB host 30 and USB device 32 is USB 2.0, and accordingly responds to the USB host 30 so that the USB host 30 inactivates its super-speed signal operation standardized in USB 3.0 specification. By following, the link layer 74 determines first usage of the first frequency calibration device 40 to receive the first type serial bus input signal transmitted from the USB host 30 for performing a first-stage first type serial bus frequency calibration.

When the first frequency calibration device 40 determined by the link layer 74 to receive the first type serial bus input signal which contains at least one periodic signal (such as a SOF packet) and a reference clock frequency, the first frequency calibration device 40 generates a first control signal, based on the at least one periodic signal (such as SOF packet) and the variable clock frequency outputted from the oscillator 42, so as to set up a first frequency tuning range of the oscillator 42 and then continuously tune the variable clock frequency outputted from the oscillator 42, until achieving a first clock frequency conforming with the interval time between said SOF periodic signals and generating a second control signal. Please further refer to FIG. 11, which shows a relative schematic diagram introducing a relationship between a sampled time "Ts1" and the first type serial bus input signal. When the first clock frequency conforming with the interval time between said SOF periodic signals is achieved, it means that the first frequency calibration device 40 accomplishes a first-stage first type serial bus frequency calibration. Then, the frequency error detector 408 of the first frequency calibration device 40 transmits a signal to inform the link layer 74 so that the link layer 74 electrically disconnects with the USB host 30 and returns to detection for switching the communication protocol mode from USB 2.0 to USB 3.0. Thus, the link layer 74 determines the usage of the second frequency calibration device 72 to start receiving the second type serial bus input signal transmitted from the USB host 30, and based on the result of calibrating the first type serial bus clock frequency resolution, a second type serial bus clock frequency resolution calibration proceeds in the next stage. It notes that after the link layer 74 determines switch of the communication protocol mode to USB 3.0, the USB device 32 is configured unable to receive the first type serial bus input signal as standardized in USB 2.0.

In the fifth embodiment shown in FIG. 15, when the link layer 74 determines usage of the second frequency calibration device 72 to receive the second type serial bus input signal transmitted from the USB host 30, the second frequency calibration device 72 generates a second control signal, based on the time information contained in the at least one specific packet of the second type serial bus input signal and the variable clock frequency outputted from the oscillator 42, to set up a second frequency tuning range of the oscillator 42 so as to vary the variable clock frequency outputted from the oscillator 42, wherein the first frequency tuning range is larger than the second frequency tuning range. Then, the varied clock frequency is fed back to the second frequency calibration device 72, and so on and so forth, so that the second frequency calibration device 72 and the oscillator 42 substantially constitute a second-stage frequency acquisition loop as shown in FIG. 10 until a second clock frequency conforming with the interval time when the at least one specific packet corresponds is achieved. In another embodiment, a counter count can be used to count up a fixed cycle numbers of or a specific time when the second-stage frequency acquisition loop 102 as shown in FIG. 10 is performed, the present clock frequency outputted from the oscillator 42 is treated as a second clock frequency.

Besides, a serial bus clock frequency calibration method according to a sixth preferred embodiment of the present invention is presented herein, with reference to the elements of the serial bus clock frequency calibration system 150 shown in FIG. 15. The method comprises the following steps of:

utilizing a link layer 74 to determine either the first frequency calibration device 40 to receive the first type serial bus (as standardized in USB 2.0 specification) input signal or the second frequency calibration device 72 to receive the second type serial bus input signal (as standardized in USB 3.0 specification);

steps S800~S840 shown in FIG. 8, if the first frequency calibration device 40 is determined by the link layer 74 to receive the first type serial bus input signal, performing a single stage first type serial bus clock frequency resolution calibration process to set up the first frequency tuning range of the oscillator 42 so as to achieve a required first clock frequency; and step S90 shown in FIG. 14, after accomplishing the first-stage first type serial bus (as standardized in USB 2.0 specification) clock frequency resolution calibration process, determining the second frequency calibration device 72 by the link layer 74 to perform a second type serial bus (as standardized in USB 3.0 specification) clock frequency resolution calibration process for continuously tuning the first clock frequency outputted from the oscillator 42.

Figure 16:
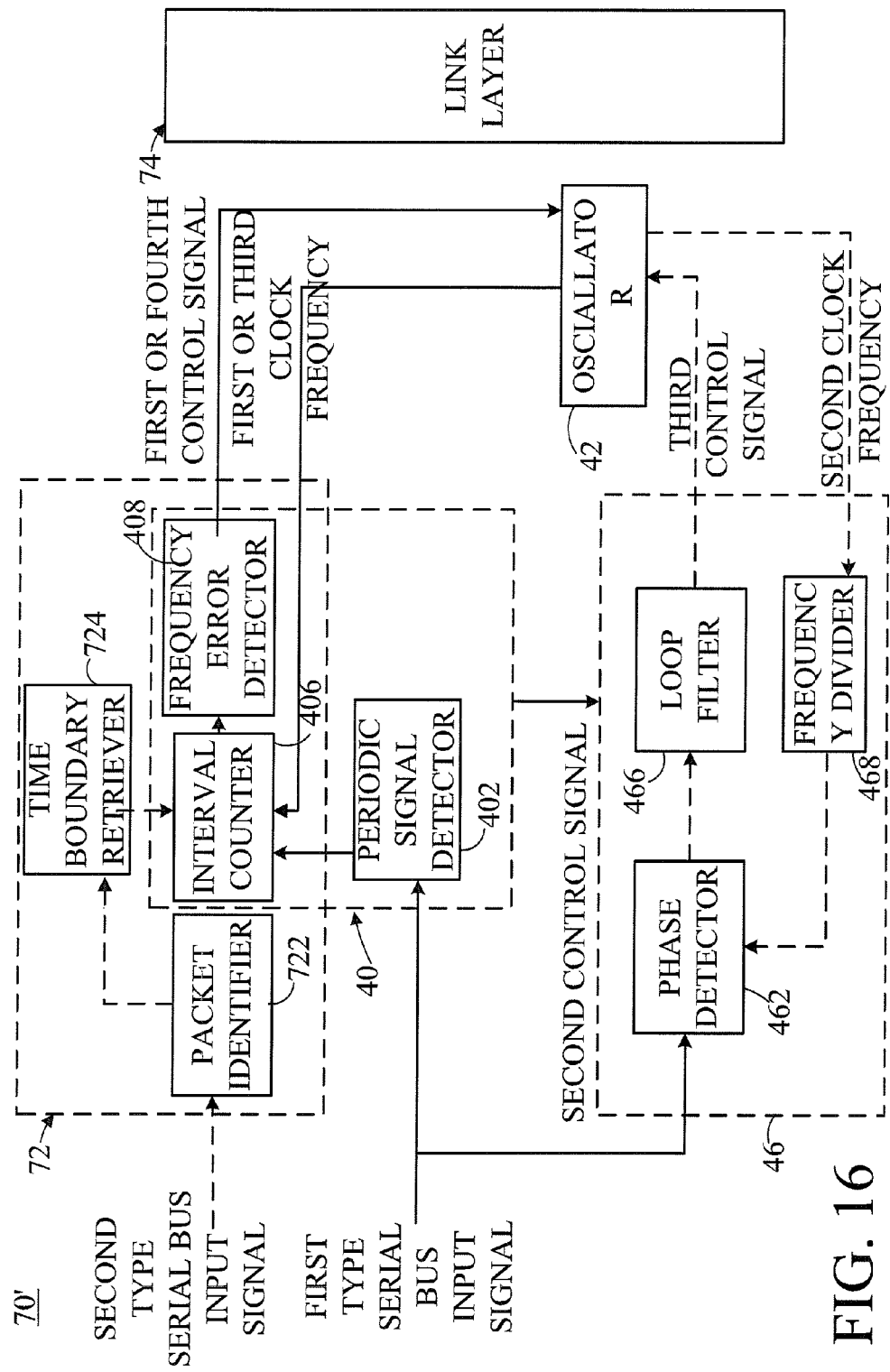
FIG. 16 is a functional block diagram showing a serial bus clock frequency calibration system according to a seventh preferred embodiment of the present invention.

Further referring to FIG. 16, a serial bus clock frequency calibration system 70' according to a seventh preferred embodiment of the present invention primarily comprises: a first frequency calibration device 40, a second frequency calibration device 46, a third frequency calibration device 72, an oscillator 42 and a link layer 74. A difference from the serial bus clock frequency calibration system 70 of the third embodiment shown in FIG. 9 is that in the seventh embodiment, the first and third frequency calibration devices 40, 72 share the same interval counter 406 and the same frequency error detector 408 but the rest components thereof including, for example, the second frequency calibration device 46, the oscillator 42 and the link layer 74 have the same structure and function as the third embodiment shown in FIGS. 9 and 10 and therefore are omitted hereafter.

Figure 17:
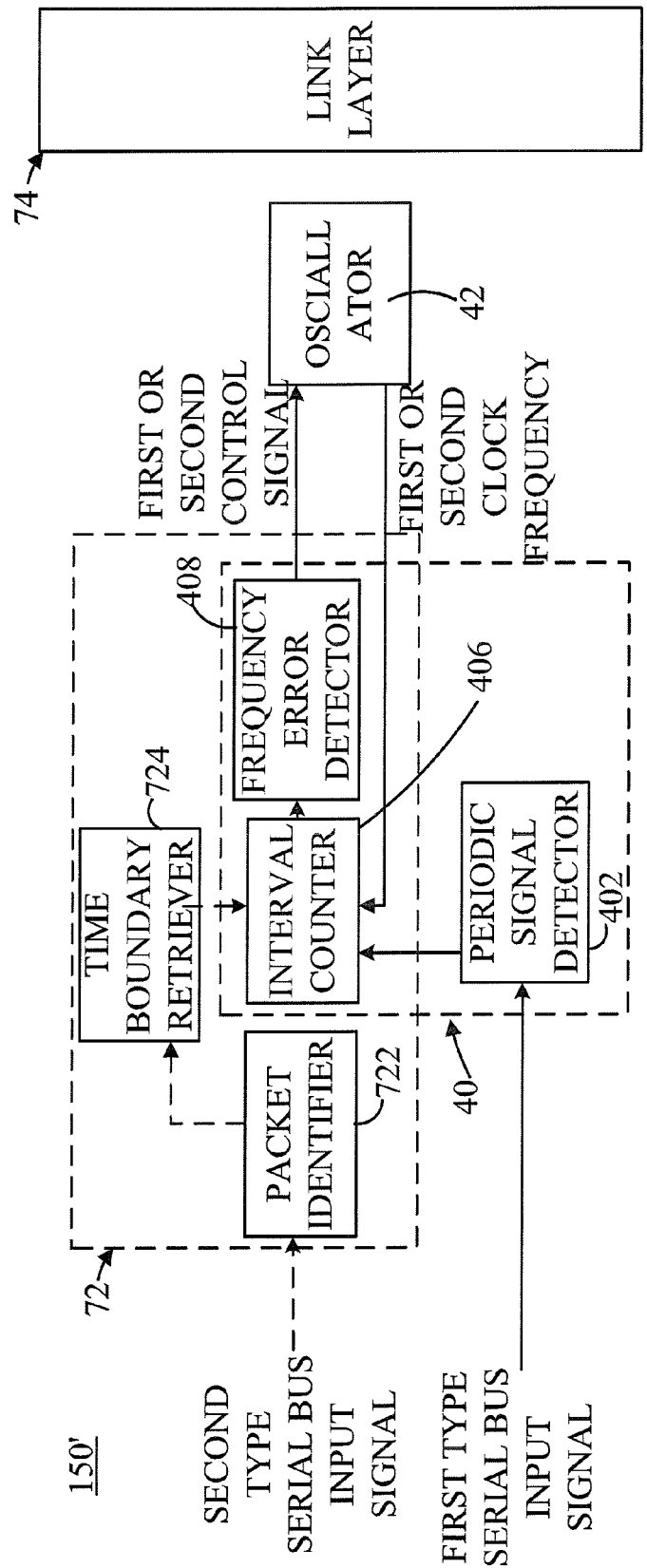
FIG. 17 is a functional block diagram showing a serial bus clock frequency calibration system according to an eighth preferred embodiment of the present invention.

Further referring to FIG. 17, a serial bus clock frequency calibration system 150' according to an eighth preferred embodiment of the present invention primarily comprises: a first frequency calibration device 40, a second frequency calibration device 72, an oscillator 42 and a link layer 74. A difference from the serial bus clock frequency calibration system 150 of the fifth embodiment shown in FIG. 15 is that in the eighth embodiment, the first and second frequency calibration devices 40, 72 share the same interval counter 406 and the same frequency error detector 408 but the rest components thereof including, for example, the oscillator 42 and the link layer 74 have the same structure and function as the fifth embodiment shown in FIG. 15 and therefore are omitted hereafter.

As described above, the serial bus clock frequency calibration system and the method thereof according to the present invention are capable of performing multi-stage clock frequency resolution calibrations with different frequency tuning ranges for different-standardized USB input signals each with operating clock frequency, wherein the serial bus clock frequency calibration system of the present invention utilizes a first frequency calibration device, a second frequency calibration device and/or a third frequency calibration device to share the same oscillator to perform a multi-stage clock frequency resolution calibration, and thereby greatly reduce the whole system complexity and the relative component costs.

As is understood by a person skilled in the art, the foregoing embodiments of the present invention are strengths of the present invention rather than limiting of the present invention. It is intended to cover various modifications and similar arrangements included within the spirit and scope of the appended claims, the scope of which should be accorded the broadest interpretation so as to encompass all such modifications and similar structures.

What is claimed is:

1. A serial bus clock frequency calibration system, comprising:
an oscillator configured to generate a variable clock frequency;
a first frequency calibration device configured to receive a first type serial bus input signal, tuning the oscillator to output a first clock frequency based on a periodic signal contained in the first type serial bus input signal and the variable clock frequency outputted from the oscillator; and
a second frequency calibration device configured to receive the first type serial bus input signal, tuning the oscillator to output a second clock frequency based on a clock signal contained in the first type serial bus input signal and the variable clock frequency outputted from the oscillator.

2. The serial bus clock frequency calibration system as claimed in claim 1, wherein the first frequency calibration device according to the periodic signal and the variable clock frequency outputted from the oscillator, generates a first control signal to the oscillator to tune the variable clock frequency to reach a first clock frequency conforming with an interval time of the periodic signal so that the first frequency calibration device and the oscillator constitute a first-stage frequency acquisition loop.

3. The serial bus clock frequency calibration system as claimed in claim 2, wherein the first frequency calibration device according to the periodic signal and the variable clock frequency outputted from the oscillator, generates a second control signal to enable the second frequency calibration device so that the second frequency calibration device according to a phase or wave edge of the reference clock frequency, generates a third control signal to the oscillator to continuously tune the variable clock frequency to reach a second clock frequency approaching the clock signal so that the second frequency calibration device and the oscillator constitute a second-stage frequency acquisition loop.

4. The serial bus clock frequency calibration system as claimed in claim 1, further comprising a third frequency calibration device which is configured to receive a second type serial bus input signal and to continuously tune the variable clock frequency outputted from the oscillator to reach a third clock frequency based on the second type serial bus input signal and the variable clock frequency outputted from the oscillator.

5. The serial bus clock frequency calibration system as claimed in claim 4, wherein the third frequency calibration device based on at least one specific packet contained in the second type serial bus input signal and the variable clock frequency outputted from the oscillator, generates a fourth control signal to tune the oscillator to output the third clock frequency conforming with an interval time corresponding to the at least one specific packet so that the third frequency calibration device and the oscillator constitute a third stage frequency acquisition loop.

6. A serial bus clock frequency calibration system, comprising:
an oscillator configured to generate a variable clock frequency;
a first frequency calibration device configured to receive a first type serial bus input signal, tuning the oscillator to output a first clock frequency based on a first information contained in the first type serial bus input signal and the variable clock frequency outputted from the oscillator; and
a second frequency calibration device configured to receive a second type serial bus input signal, tuning the oscillator to output a second clock frequency based on a second information contained in the second type serial bus input signal and the variable clock frequency outputted from the oscillator, wherein the first information is different from the second information.

7. The serial bus clock frequency calibration system as claimed in claim 6, wherein the first information is a periodic signal, and the second information is a time information contained in at least one specific packet.

8. The serial bus clock frequency calibration system as claimed in claim 7, wherein the first frequency calibration device according to the periodic signal and the variable clock frequency outputted from the oscillator, generates a first control signal to the oscillator to tune the variable clock frequency to reach a first clock frequency conforming with an interval time of the periodic signal so that the first frequency calibration device and the oscillator constitute a first-stage frequency acquisition loop.

9. The serial bus clock frequency calibration system as claimed in claim 8, wherein the second frequency calibration device based on the at least one specific packet contained in the second type serial bus input signal and the variable clock frequency outputted from the oscillator, generates a second control signal to tune the oscillator to output the second clock frequency conforming with an interval time corresponding to the at least one specific packet so that the second frequency calibration device and the oscillator constitute a second stage frequency acquisition loop.

10. The serial bus clock frequency calibration system as claimed in claim 9, wherein the second frequency calibration device further comprises:
- a packet identifier for identifying at least one of a plurality of specific packets from the second type serial bus input signal to achieve the time information contained in the at least one specific packet;
- a time boundary retriever according to said time information, generating a time boundary of the interval time when the at least one specific packet belongs;
- an interval counter utilizing the variable clock frequency outputted from the oscillator to calculate a count difference from the time boundary of the interval time when the at least one specific packet belongs to another time boundary of another interval time when another one of the specific packets belongs, wherein said count difference is treated as a working count value; and
- a frequency error detector according to a comparing result between the working count value and a predetermined goal count value, generating the second control signal.

11. The serial bus clock frequency calibration system as claimed in claim 9, wherein the first control signal and the second control signal respectively comprises a set of variable switch signals, and the oscillator further has a plurality of capacitor banks each composed of a plurality of capacitors with different sizes or the same size, wherein each capacitor is connected to a switch which is controlled by the variable switch signals to tune the variable clock frequency outputted from the oscillator.

12. The serial bus clock frequency calibration system as claimed in claim 9, wherein either the first control signal or the second control signal is a voltage signal, and the oscillator is a voltage-controlled oscillator having a plurality of variable capacitor, wherein by varying the voltage level of either the first control signal or the second control signal, the variable clock frequency outputted from the oscillator is varied.

13. The serial bus clock frequency calibration system as claimed in claim 12, wherein the capacitors are a PMOS or CMOS device.

14. The serial bus clock frequency calibration system as claimed in claim 6, further comprising a link layer for determining either the first frequency calibration device to receive the first type serial bus input signal or the second frequency calibration device to receive the second type serial bus input signal.

15. The serial bus clock frequency calibration system as claimed in claim 10, wherein the first frequency calibration device and the second frequency calibration device share the same interval counter and frequency error detector.

16. A serial bus clock frequency calibration system, comprising:
- an oscillator configured to generate a variable clock frequency;
- a packet identifier for identifying at least one of a plurality of specific packets from a serial bus input signal to achieve a time information contained in the at least one specific packet;
- a time boundary retriever according to said time information, generating a time boundary of the interval time when the at least one specific packet belongs;
- an interval counter utilizing the variable clock frequency outputted from the oscillator to calculate a count difference from the time boundary of the interval time when the at least one specific packet belongs to another time boundary of another interval time when another one of the specific packets belongs, wherein said count difference is treated as a working count value; and
- a frequency error detector according to a comparing result between the working count value and a predetermined goal count value, generating a control signal to vary or maintain the variable clock frequency outputted from the oscillator.

17. A serial bus clock frequency calibration method applied for a serial bus clock frequency calibration system which has a first frequency calibration device, a second frequency calibration device, a third frequency calibration device and an oscillator, and the method comprising the following steps of:
- the first frequency calibration device receiving a first type serial bus input signal, varying or maintaining a variable clock frequency outputted from the oscillator to conform with an interval time of a periodic signal, according to a difference between the first type serial bus input signal and the variable clock frequency outputted from the oscillator;
- the second frequency calibration device according to a difference between a clock signal contained in the first type serial bus input signal and the variable clock frequency outputted from the oscillator, varying or maintaining the variable clock frequency outputted from the oscillator to conform with the clock signal; and
- the third frequency calibration device receiving a second type serial bus input signal containing at least one specific packet, and based on whether an interval time corresponding to the at least one specific packet and calculated by different clock frequencies outputted from the oscillator is correct or not, varying or maintaining the variable clock frequency outputted from the oscillator to conform with the interval time corresponding to the at least one specific packet.

18. The serial bus clock frequency calibration method as claimed in claim 17, wherein the periodic signal is a start of frame (SOF) signal, and the at least one specific packet is an isochronous timestamp packet (ITP).

19. The serial bus clock frequency calibration method as claimed in claim 17, further comprising the following steps of:
- the first frequency calibration device transmitting a first control signal to vary or maintain the variable clock frequency outputted from the oscillator, and generating a second control signal;
- the second frequency calibration device transmitting a third control signal to vary or maintain the variable clock frequency outputted from the oscillator; and
- the third frequency calibration device receiving the second type serial bus input signal and generating a fourth control signal to vary or maintain the variable clock frequency outputted from the oscillator, and continuously tuning the variable clock frequency outputted from the oscillator to conform with an interval time corresponding to the at least one specific packet.

20. The serial bus clock frequency calibration method as claimed in claim 19, further comprising the following steps of:
- utilizing the third frequency calibration device, according to the variable clock frequency outputted from the oscillator, calculating a count difference from a time boundary of the interval time when at least one of a plurality of specific packets belongs to another time boundary of another interval time when another one of the specific packets belongs, wherein said count difference is treated as a working count value;

according to a comparing result between the working count value and a predetermined goal count value, generating the fourth control signal;

when the working count value is different from the predetermined goal count value, modifying an output level of the fourth control signal to vary the variable clock frequency outputted from the oscillator; and when the working count value is identical to a predetermined goal count value, fixing the output level of the fourth control signal to maintain the variable clock frequency outputted from the oscillator.

21. A serial bus clock frequency calibration method applied for a serial bus clock frequency calibration system which has a first frequency calibration device, a second frequency calibration device and an oscillator, and the method comprising the following steps of:

the first frequency calibration device receiving a first type serial bus input signal containing a first information, performing a first-stage clock frequency resolution calibration process on the variable clock frequency outputted from the oscillator and thereby achieving a first clock frequency; and the second frequency calibration device receiving a second type serial bus input signal containing a second information, performing a second-stage clock frequency resolution calibration process on the variable clock frequency outputted from the oscillator and thereby achieving a second clock frequency.

22. The serial bus clock frequency calibration method as claimed in claim 21, wherein the first information contains at least one periodic signal and the first clock frequency conforms with an interval time of the at least one periodic signal, and the second information contains at least one specific packet and the second clock frequency conforms with an interval time corresponding to the at least one specific packet.

23. The serial bus clock frequency calibration method as claimed in claim 21, wherein after the first-stage frequency calibration process is accomplished, the second frequency calibration device is configured to succeedingly perform the second-stage clock frequency resolution calibration process based on the first clock frequency outputted from the oscillator.

24. The serial bus clock frequency calibration method as claimed in claim 21, further comprising a step of using a link layer to determine either the first frequency calibration device to receive the first type serial bus input signal or the second frequency calibration device to receive the second type serial bus input signal.

25. The serial bus clock frequency calibration method as claimed in claim 21, wherein the first type serial bus input signal and the second type serial bus input signal belong to different communication protocol modes.

* * * * *